(12) United States Patent
Sasaki

(10) Patent No.: US 10,573,449 B2
(45) Date of Patent: Feb. 25, 2020

(54) TUNNEL MAGNETORESISTIVE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/081,022

(22) PCT Filed: Oct. 16, 2017

(86) PCT No.: PCT/JP2017/037417
§ 371 (c)(1),
(2) Date: Aug. 29, 2018

(87) PCT Pub. No.: WO2019/077661
PCT Pub. Date: Apr. 25, 2019

(65) Prior Publication Data
US 2019/0180900 A1 Jun. 13, 2019

(51) Int. Cl.
| | |
|---|---|
| *H01L 43/10* | (2006.01) |
| *H01F 10/32* | (2006.01) |
| *H01L 43/02* | (2006.01) |
| *G11C 11/16* | (2006.01) |
| *H01L 27/22* | (2006.01) |
| *H01L 43/12* | (2006.01) |
| *H01F 41/34* | (2006.01) |

(Continued)

(52) U.S. Cl.
CPC ........ *H01F 10/3259* (2013.01); *G11C 11/161* (2013.01); *H01F 10/329* (2013.01); *H01F 10/3272* (2013.01); *H01F 10/3286* (2013.01); *H01F 41/34* (2013.01); *H01L 27/222* (2013.01); *H01L 27/228* (2013.01); *H01L 43/02* (2013.01); *H01L 43/06* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 8,542,524 B2 | 9/2013 | Keshtbod et al. | |
| 8,860,156 B2 | 10/2014 | Beach et al. | |

(Continued)

FOREIGN PATENT DOCUMENTS

| | | |
|---|---|---|
| JP | 2002-299726 A | 10/2002 |
| JP | 5586028 B2 | 9/2014 |

(Continued)

*Primary Examiner* — Cheung Lee
(74) *Attorney, Agent, or Firm* — Oliff PLC

(57) ABSTRACT

A TMR element includes a magnetic tunnel junction element unit and a side wall portion that includes an insulation material and is disposed on a side surface of the magnetic tunnel junction element unit. The magnetic tunnel junction element unit includes a reference layer, a magnetization free layer, a tunnel barrier layer that is stacked in a stack direction between the reference layer and the magnetization free layer, and a cap layer is stacked on the side of the magnetization free layer opposite to the tunnel barrier layer side. The side wall portion includes a first region that includes the insulation material and covers a side surface of at least one of the reference layer, the tunnel barrier layer, the magnetization free layer, or the cap layer of the magnetic tunnel junction element unit.

7 Claims, 20 Drawing Sheets

(51) Int. Cl.
*H01L 43/08* (2006.01)
*H01L 43/06* (2006.01)

(56) References Cited

U.S. PATENT DOCUMENTS

| | | |
|---|---|---|
| 8,921,961 B2 | 12/2014 | Kula et al. |
| 9,006,704 B2 | 4/2015 | Jan et al. |
| 2002/0191354 A1 | 12/2002 | Yoshikawa et al. |
| 2012/0091548 A1 | 4/2012 | Sukegawa et al. |
| 2013/0221461 A1 | 8/2013 | Sukegawa et al. |
| 2014/0103469 A1 | 4/2014 | Jan et al. |
| 2016/0197268 A1 | 7/2016 | Yakabe et al. |
| 2018/0005746 A1* | 1/2018 | Thomas ................ B24B 37/20 |

FOREIGN PATENT DOCUMENTS

| | | |
|---|---|---|
| JP | 5988019 B2 | 9/2016 |
| JP | 6103123 B1 | 3/2017 |
| WO | 2015/141673 A1 | 9/2015 |

* cited by examiner

*Fig.7*
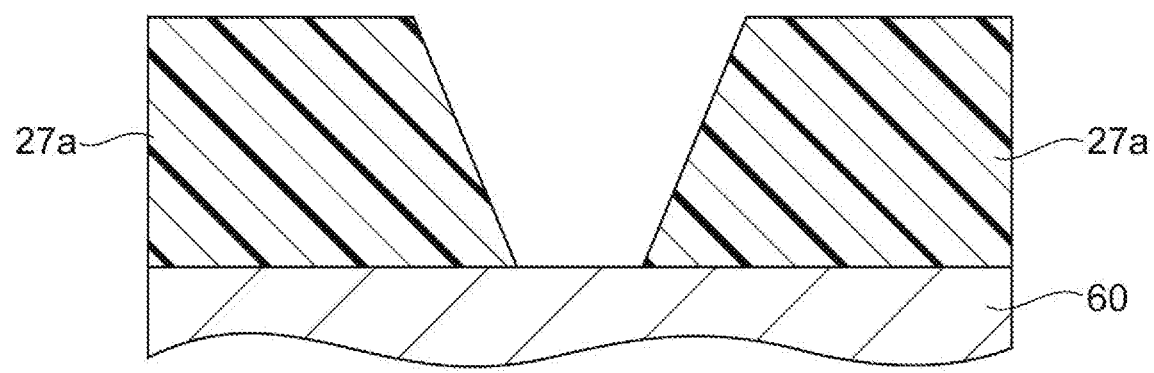
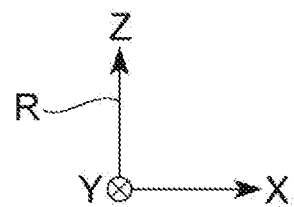

Fig.8
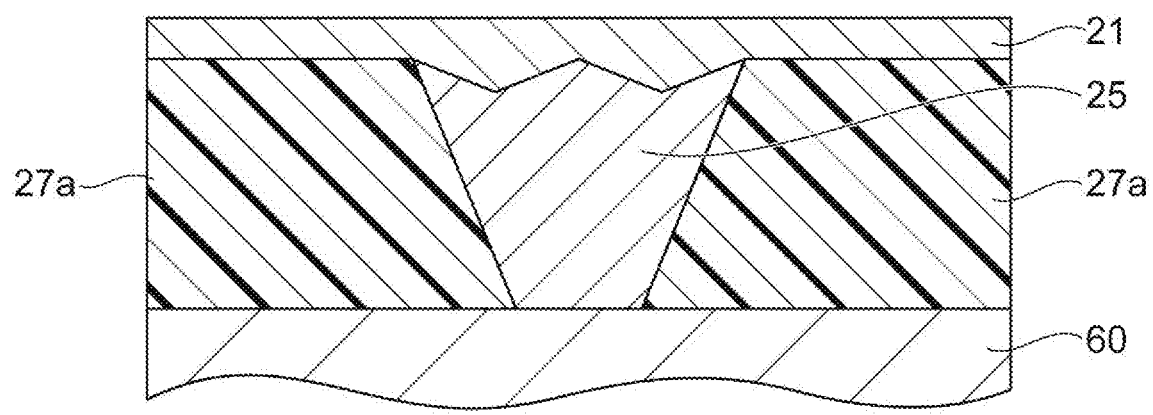
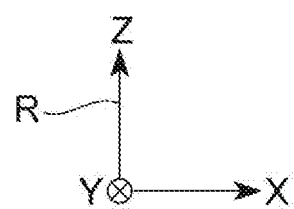

Fig.9
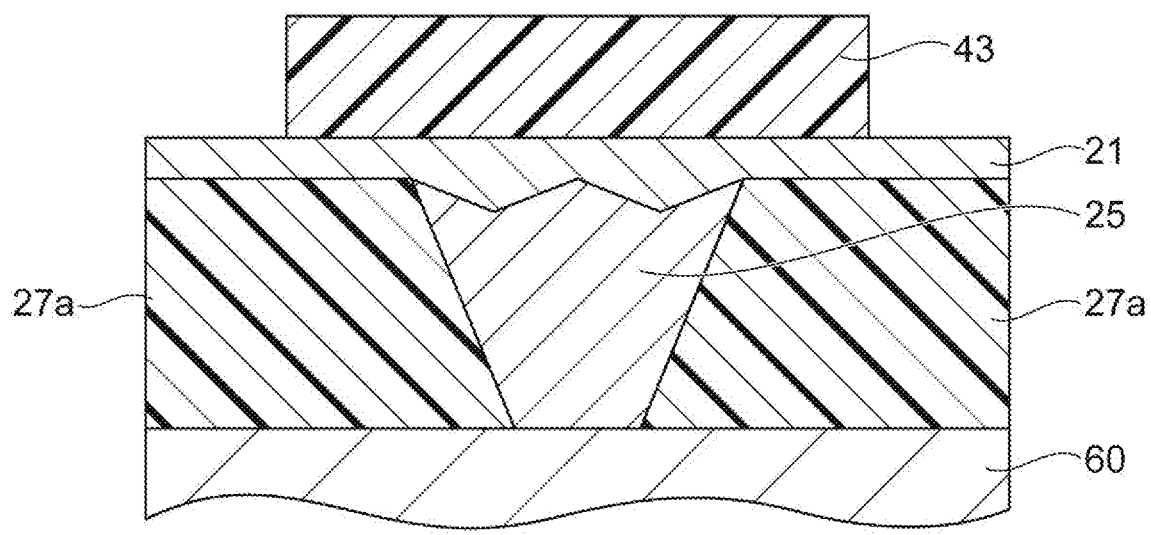
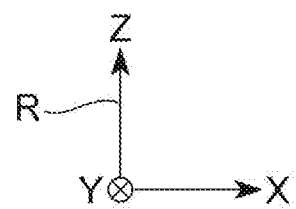

Fig.10
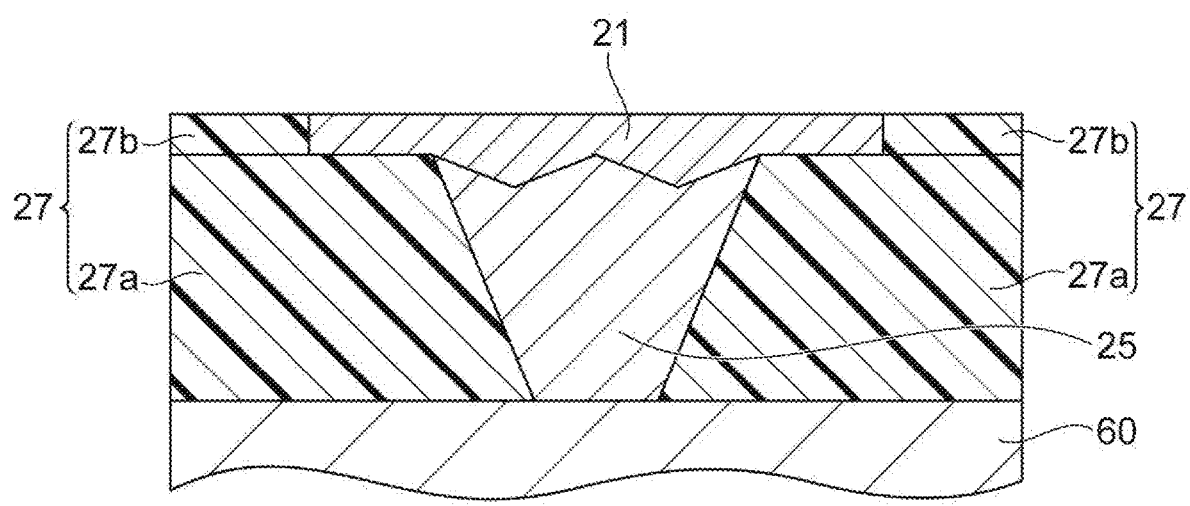
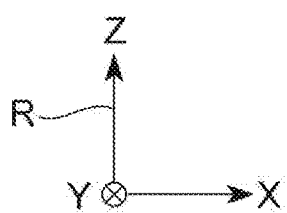

Fig.13
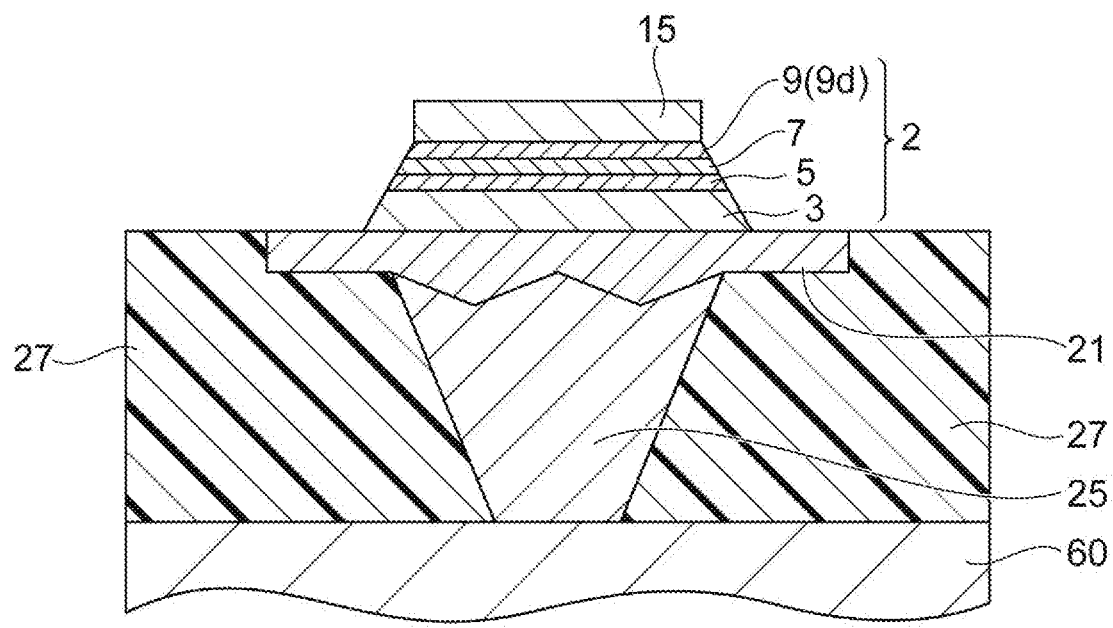
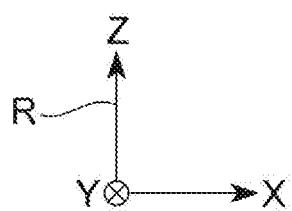

Fig.14
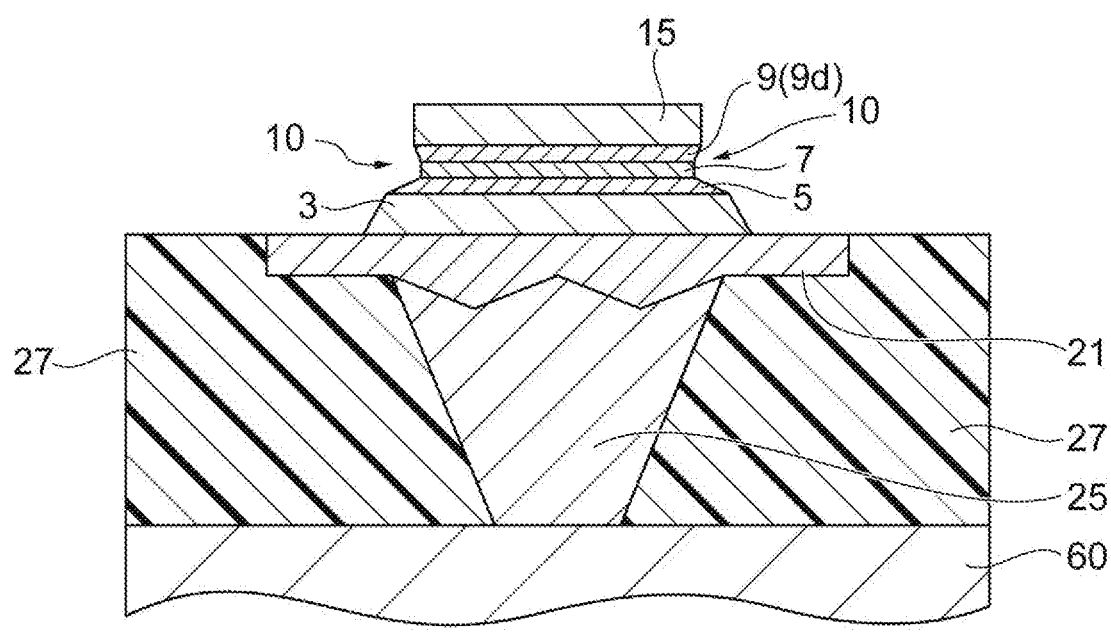
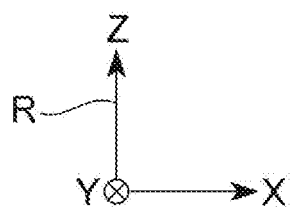

Fig.15
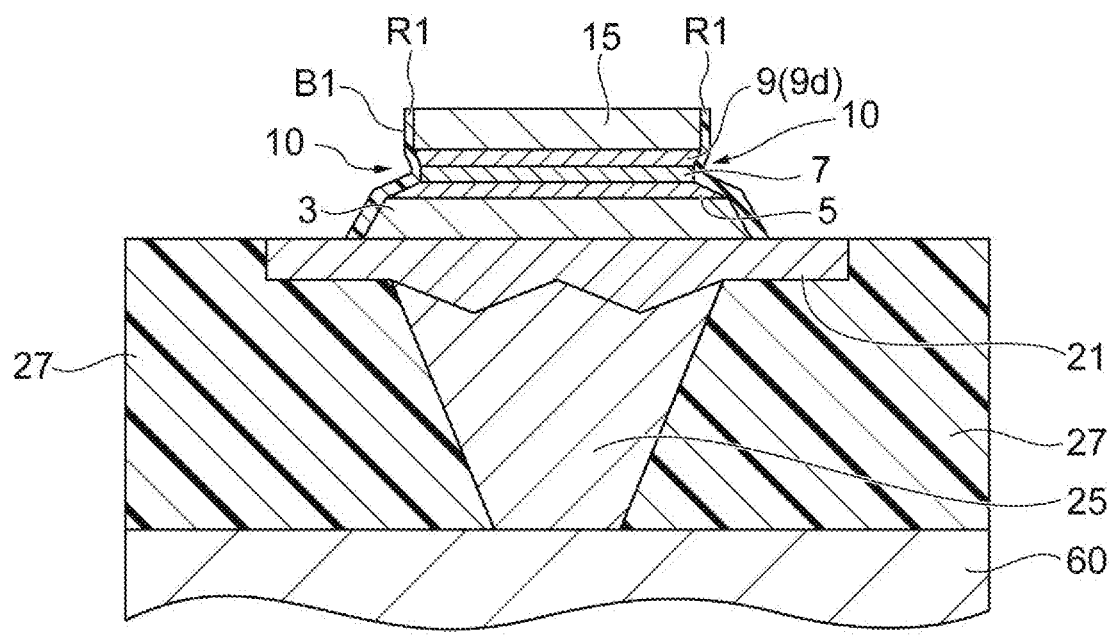
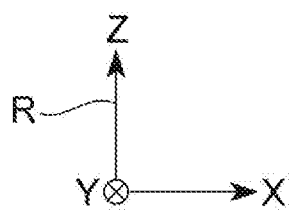

Fig.16
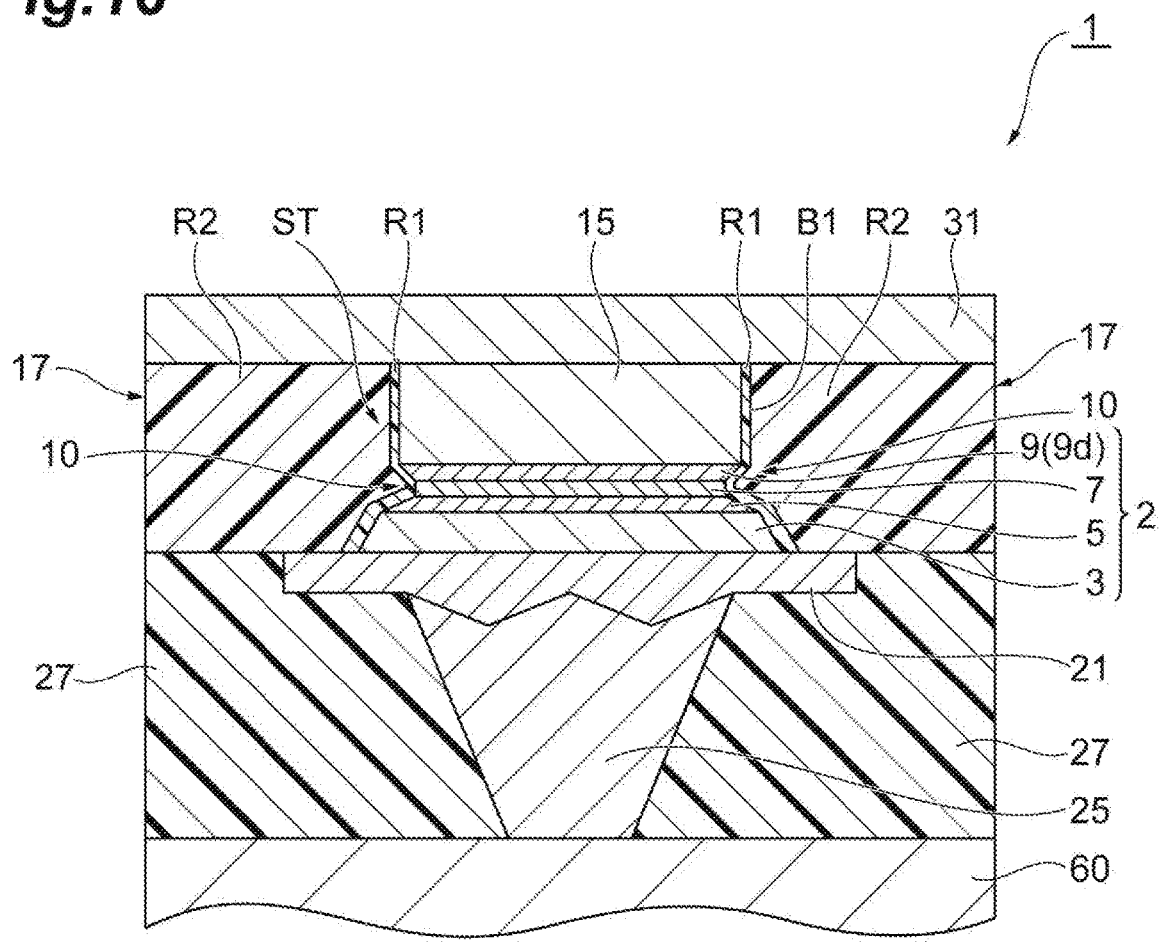
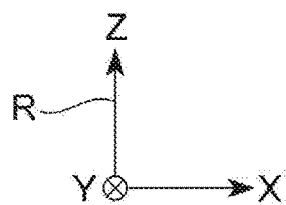

TUNNEL MAGNETORESISTIVE EFFECT ELEMENT

TECHNICAL FIELD

The present disclosure relates to a tunnel magnetoresistive effect element, a magnetic memory, a built-in memory, and a method of manufacturing a tunnel magnetoresistive effect element.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a nonmagnetic spacer layer, and a magnetization free layer are stacked in this order are known. Among the magnetoresistive effect elements, the TMR element that uses an insulation layer (tunnel barrier layer) as the non-magnetic spacer layer generally has high element resistance but can realize a high magnetoresistive (MR) ratio, compared to the GMR element that uses a conductive layer as the non-magnetic spacer layer. Thus, the EVER element has drawn attention as an element used in a magnetic sensor, a magnetic head, a magnetoresistive random access memory (MRAM), and the like (for example, Patent Literatures 1 and 2 below).

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element. For example, applying this technology to the MRAM can reduce the size of a memory cell and thus can achieve high density for the reason that an interconnect for magnetic field generation for reversing the magnetization direction of the magnetization free layer is not necessary. Generally, the MRAM that uses the magnetization reversal technology based on the STT is called an "STT-MRAM".

A manufacturing process for a semiconductor device called the STT-MRAM may include an annealing step under a high temperature atmosphere of, for example, 300 degrees Celsius or higher (for example, Patent Literatures 4 to 6 below). The annealing step under the high temperature atmosphere is performed in order to improve the film quality and the crystallinity of the TMR element included in the STT-MRAM.

CITATION LIST

Patent Literature

[Patent Literature 1] Japanese Patent No. 5586028
[Patent Literature 2] Japanese Patent No. 5988019
[Patent Literature 3] U.S. Pat. No. 8,921,961
[Patent Literature 4] U.S. Pat. No. 8,860,156
[Patent Literature 5] U.S. Pat. No. 9,006,704
[Patent Literature 6] U.S. Pat. No. 8,542,524

SUMMARY

According to the annealing step under the high temperature atmosphere, the film quality and the crystallinity of the TMR element are improved. However, a part of chemical elements constituting a magnetic tunnel junction element unit of the TMR element, for example, may move by diffusion or the like to a side wall portion which is disposed outside the magnetic tunnel junction element unit. When a part of the chemical elements constituting the magnetic tunnel junction element unit move to the side wall portion, the composition of the chemical elements included in the magnetic tunnel junction unit is changed from that before the annealing step. Consequently, the magnetic tunnel junction element unit may not satisfy a predetermined characteristic. It is desirable to suppress the movement of the chemical elements constituting the magnetic tunnel junction element unit to the side wall portion in addition to an improvement of the film quality and the crystallinity of the TYR element in the annealing step under the high temperature atmosphere.

The present disclosure is conceived in view of the above problem. An object of the present disclosure is to provide a TMR element that can reduce the movement of chemical elements constituting a magnetic tunnel junction element unit to a side wall portion. In addition, an object of the present disclosure is to provide a magnetic memory that includes the TMR element, and a built-in memory that includes the magnetic memory. Furthermore, an object of the present disclosure is to provide a method of manufacturing a TMR element that can reduce the movement of chemical elements constituting a magnetic tunnel junction element unit to a side wall portion.

In order to resolve the above problem, a tunnel magnetoresistive effect (TMR) element according to one aspect of the present disclosure includes a magnetic tunnel junction element unit and a side wall portion including an insulation material and is disposed on a side surface of the magnetic tunnel junction element unit. The magnetic tunnel junction element unit includes a reference layer, a magnetization free layer, a tunnel barrier layer that is stacked along a stack direction between the reference layer and the magnetization free layer, and a cap layer is stacked on the side of the magnetization free layer opposite to the tunnel barrier layer side. The side wall portion includes a first region that includes the insulation material and covers a side surface of at least one of the reference layer, the tunnel barrier layer, the magnetization free layer, and the cap layer of the magnetic tunnel junction element unit. The first region includes, as a contained chemical element, at least one of chemical elements (except oxygen) that constitute the at least one of the reference layer, the tunnel barrier layer, the magnetization free layer, and the cap layer of the magnetic tunnel junction element unit.

In the TMR element according to one aspect of the present disclosure, the side surface of the magnetic tunnel junction element unit is covered with the first region that includes the insulation material. Since the first region includes, as the contained chemical element, the chemical element that constitutes the layer of the magnetic tunnel junction element unit covered with the first region, entropy related to the contained element in the covered layer and the first region is increased, compared to that when only a chemical element different from the chemical element constituting the covered layer is present in the first region. Thus, the chemical element constituting the layer covered with the first region does not easily diffuse thermodynamically toward the first region from the covered layer, compared to that when only the chemical element different from the chemical element constituting the covered layer is present in the first region. Consequently, even when the magnetic tunnel junction element unit is annealed under a high temperature atmosphere at the time of manufacturing the TMR element, the movement of the contained chemical element to the side wall portion is reduced. Since a change in the composition of the chemical element constituting the magnetic tunnel junction element unit is suppressed, the TMR element according to one aspect of the present disclosure can maintain a predetermined characteristic such as a high MR ratio.

Furthermore, in the TMR element according to one aspect of the present disclosure, the side wall portion may include a second region that includes the insulation material and covers an outer periphery of the first region, and the First region may be positioned between the magnetic tunnel junction element unit and the second region. Accordingly, since the second region that includes the insulation material is disposed in the side wall portion, the insulation properties of the side wall portion are further improved.

Furthermore, in the TMR element according to one aspect of the present disclosure, the first region may include a nitride that includes at least one of B, Al, and Si as the contained chemical element, and the second region may include a nitride that includes at least one of B, Al, and Si as a contained chemical element. Accordingly, the first region and the second region have high insulation properties. In addition, when the chemical element is unlikely to diffuse between the magnetic tunnel junction element unit and the side wall portion at the time of the annealing step for the magnetic tunnel junction element unit, a change in the element resistance of the TMR element before and after the annealing step is reduced.

Furthermore, in the TMR element according to one aspect of the present disclosure, a distance from the outer periphery of the first region to a side surface of the reference layer may be greater than or equal to 3 nm. Accordingly, by the annealing of the magnetic tunnel junction element unit under the high temperature atmosphere of 400 degrees Celsius, the movement of the chemical element constituting the reference layer of the magnetic tunnel junction element unit to the side wall portion is particularly reduced. A decrease in magnetic characteristics in the TMR element is suppressed.

Furthermore, in the TMR element according to one aspect of the present disclosure, a distance from an outer periphery of the first region to a side surface of the tunnel barrier layer may be greater than a distance from the outer periphery of the first region to a side surface of the cap layer. Accordingly, the movement of the chemical element of the tunnel barrier layer that significantly affects the characteristics of the TMR element is particularly reduced.

Furthermore, in the TMR element according to one aspect of the present disclosure, the first region may include a nitride that includes at least one of Co, Fe, and Ta as the contained chemical element. Accordingly, since the first region includes a chemical element such as Co, Fe, and Ta that move particularly easily, the movement of the chemical element at the time of annealing is prevented by the first region. Thus, the effect of the present disclosure of reducing the movement of the chemical element constituting the magnetic tunnel junction element unit to the side wall portion s particularly effectively exhibited.

Furthermore, in the TMR element according to one aspect of the present disclosure, a magnetization direction of the reference layer may be substantially fixed along the stack direction. The cap layer may include a perpendicular magnetization inducing layer. The perpendicular magnetization inducing layer may impart magnetic anisotropy along the stack direction to the magnetization free layer.

Furthermore, in the TMR element according to one aspect of the present disclosure, the tunnel barrier layer may be formed of an oxide material that has a spinel structure represented by General Formula $AB_2O_4$ (in the formula, A is at least one kind of chemical element selected from a group consisting of Mg and Zn, and B is at least one kind of chemical element selected from a group consisting of Al, Ga, and In).

In the TMR element according to one aspect of the present disclosure, the tunnel barrier layer is formed of the oxide material that has the spinel structure which is a crystal structure replaceable with various chemical elements. Since the material can particularly effectively impart magnetic anisotropy in the stack direction to the magnetization free layer, the direction of an easy magnetization axis of the magnetization free layer can be particularly stably set in a perpendicular direction.

In addition, a magnetic memory according to one aspect of the present disclosure includes any of the TMR elements as a storage element.

In addition, a built-in memory according to one aspect of the present disclosure includes the magnetic memory.

Furthermore, a method of manufacturing a tunnel magnetoresistive effect element (TMR element) according to one aspect of the present disclosure includes a step of forming a magnetoresistive stack film in which a reference layer, a tunnel barrier layer, a magnetization free layer, and a cap layer are stacked in this order, a step of forming a magnetic tunnel junction element unit that extends in a stack direction and includes the reference layer, the tunnel barrier layer, the magnetization free layer, and the cap layer, by etching the magnetoresistive stack film, and a step of forming a first region that includes an insulation material and covers a side surface of the magnetic tunnel junction element unit, the first region covering a side surface of at least one of the reference layer, the tunnel barrier layer, the magnetization free layer, and the cap layer of the magnetic tunnel junction element unit. The first region includes, as a contained chemical element, at least one of chemical elements (except oxygen) that constitute the at least one of the reference layer, the tunnel barrier layer, the magnetization free layer, and the cap layer of the magnetic tunnel junction element unit.

According to the method of manufacturing the TMR element according to one aspect of the present disclosure, the first region that includes the chemical element constituting the magnetic tunnel junction element unit is formed. Since the first region covers the side surface of the magnetic tunnel junction element unit, the first region reduces the movement of the chemical element constituting the layer of the magnetic tunnel junction element unit in contact with the first region to the side wall portion even when the magnetic tunnel junction element unit is annealed under the high temperature atmosphere at the time of manufacturing the TMR element. Since a change in the composition of the chemical element constituting the magnetic tunnel junction element unit is suppressed even after the magnetic tunnel junction element unit is annealed, the manufactured TMR element can maintain a predetermined characteristic that is a high MR ratio.

According to the present disclosure, a TMR element that can reduce the movement of chemical elements constituting a magnetic tunnel junction element unit to a side wall portion is provided. In addition, a magnetic memory that includes the TMR element, and a built-in memory that includes the magnetic memory are provided. Furthermore, a method of manufacturing a TMR element that can reduce the movement of chemical elements constituting a magnetic tunnel junction element unit to a side wall portion is provided.

BRIEF DESCRIPTION OF DRAWINGS

FIG. 7 is a view illustrating a cross-section for describing the specific example of the manufacturing method for the TMR element of the first embodiment.

FIG. 8 is a view illustrating a cross-section for describing the specific example of the manufacturing method for the TMR element of the first embodiment.

FIG. 9 is a view illustrating a cross-section for describing the specific example of the manufacturing method for the TMR element of the first embodiment.

FIG. 10 is a view illustrating a cross-section for describing the specific example of the manufacturing method for the TMR element of the first embodiment.

FIG. 13 is a view illustrating a cross-section for describing the specific example of the manufacturing method for the TMR element of the first embodiment.

FIG. 14 is a view illustrating a cross-section for describing the specific example of the manufacturing method for the TMR element of the first embodiment.

FIG. 15 is a view illustrating a cross-section for describing the specific example of the manufacturing method for the TMR element of the first embodiment.

FIG. 16 is a view illustrating a cross-section for describing the specific example of the manufacturing method for the TMR element of the first embodiment.

DESCRIPTION OF EMBODIMENTS

Figure 1:
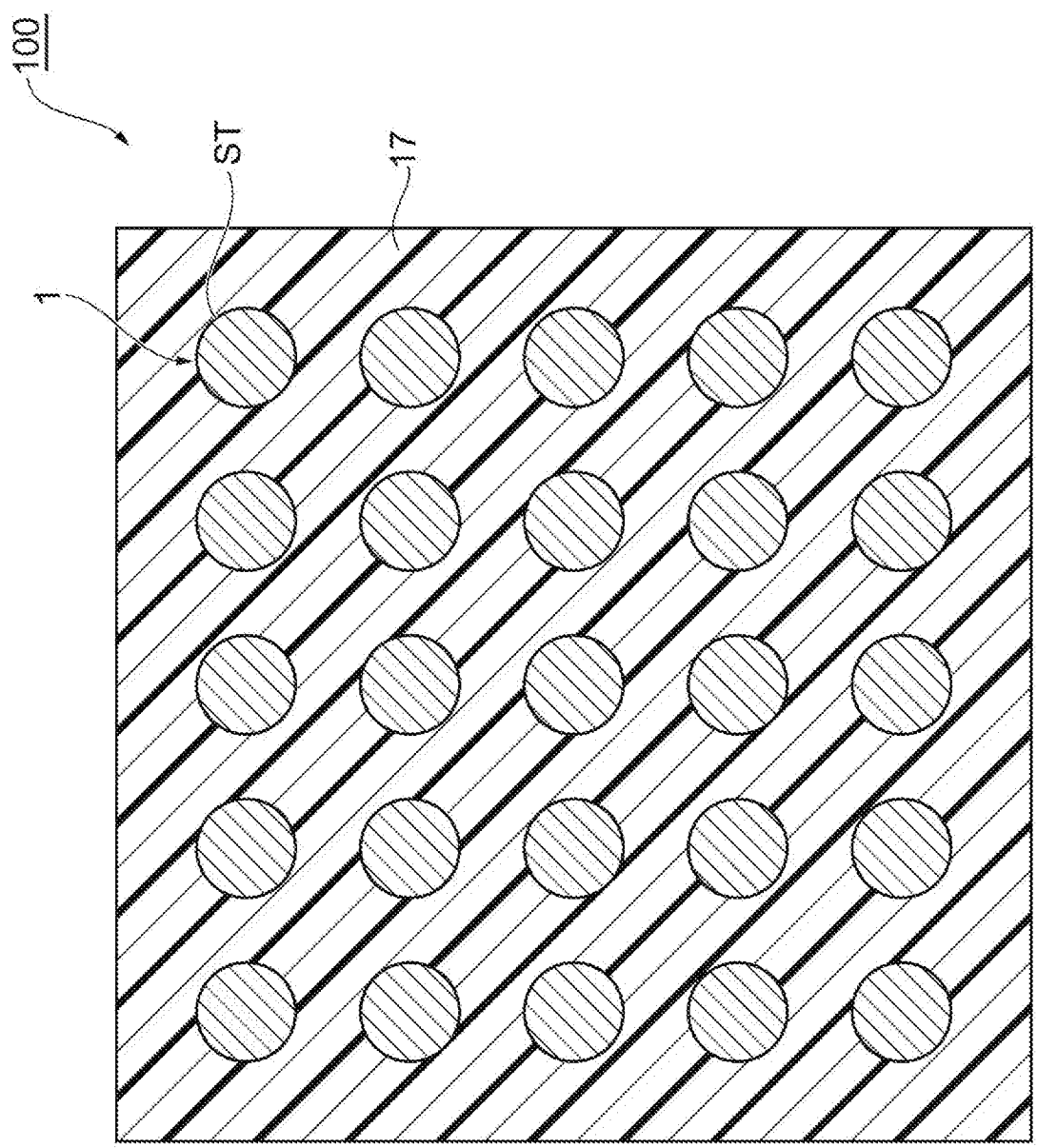
FIG. 1 is a cross-sectional plan view of an MRAM that includes a TMR element of a first embodiment.

Hereinafter, embodiments of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

(First Embodiment)

Figure 2:
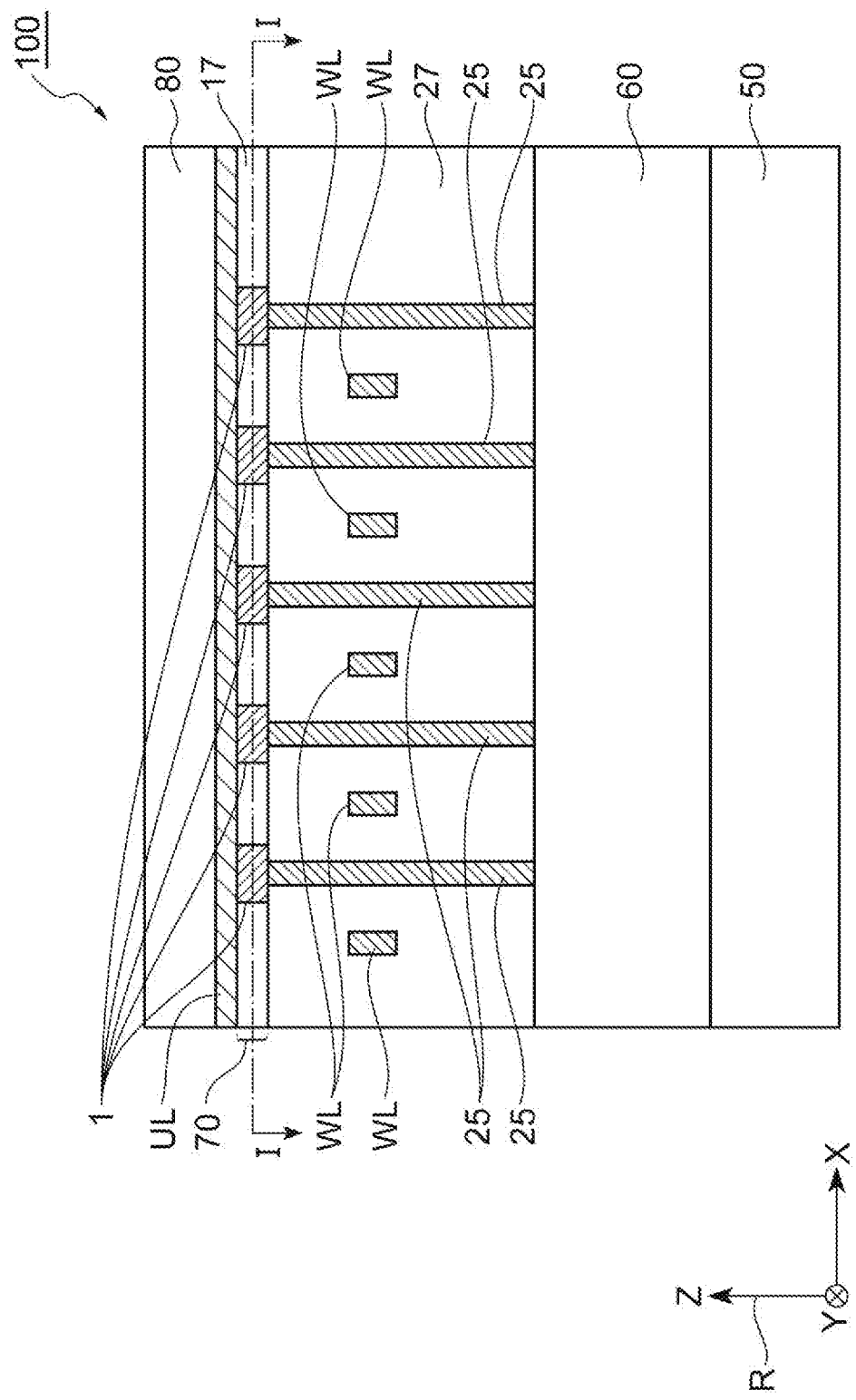
FIG. 2 is a schematic view of a vertical cross-section of the MRAM according to the first embodiment.

FIG. 1 is a cross-sectional plan view of a magnetic memory (magnetoresistive random access memory; MRAM) that includes a perpendicular magnetization tunnel magnetoresistive effect element (TMR element) according to the present embodiment. FIG. 2 is a schematic view of a vertical cross-section of the MRAM according to the present embodiment. FIG. 1 corresponds to a section of an MRAM 100 taken along line I-I in FIG. 2. A three-dimensional orthogonal coordinate system R is illustrated in FIG. 1 and the subsequent drawings when necessary. When the three-dimensional orthogonal coordinate system R is used, the thickness direction of each layer is set along a Z-axis direction, and two orthogonal axes that are perpendicular to the Z axis are set along an X axis and a Y axis.

As illustrated in FIG. 1, the MRAM 100 of the present embodiment includes a plurality of TMR elements 1 that are arranged in an array form (five rows and five columns in FIG. 1) in an XY plane. Each of the plurality of TMR elements 1 functions as a storage element of the MRAM 100. As will be described in detail later, each TMR element 1 includes a stack portion. ST and a side wall portion 17 in which the stack portion ST is embedded. In addition, as illustrated in FIG. 2, the MRAM 100 includes a semiconductor substrate 50, a transistor array 60, a via interconnect part 25, an interlayer insulation layer 27, a word line WL, a TMR element array 70 including the side wall portion 17, an upper interconnect UL, and an insulation body 80 that covers the upper surface of the upper interconnect UL. In FIG. 1 and FIG. 2, other electrical interconnects that connect the upper interconnect UL to the transistor array 60 are not illustrated except the word line WL.

The transistor array 60 is disposed on the principal surface of the semiconductor substrate 50 that extends along the XY plane. The MRAM 100 includes a plurality of transistors T (refer to FIG. 3) that are disposed in an array form in order to drive the plurality of TMR elements 1. A plurality of the via interconnect parts 25 and a plurality of the word lines WL are disposed on the transistor array 60. Each via interconnect part 25 electrically connects one of the plurality of transistors T of the transistor array 60 to the plurality of TMR elements 1 of the TMR element array 70. The plurality of via interconnect parts 25 and the plurality of word lines WL are embedded in the interlayer insulation layer 27 and are insulated from each other by the interlayer insulation layer 27.

Figure 3:
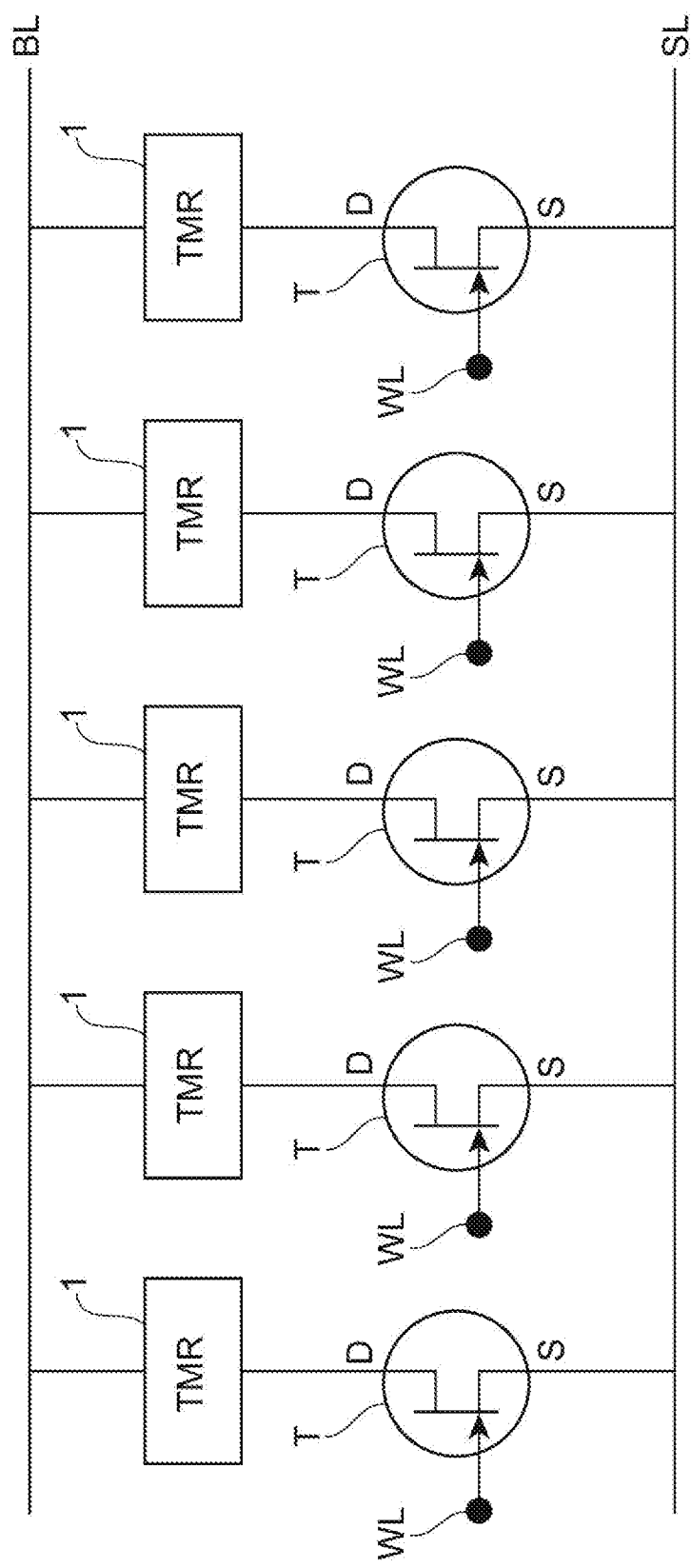
FIG. 3 is a view illustrating the electrical connection of the MR IM of the first embodiment.

FIG. 3 is a view illustrating the electrical connection of the MRAM of the present embodiment. In FIG. 3, only electrical connection related to five TMR elements 1 of the plurality of TMR elements 1 of the TMR element array 70 is illustrated.

As illustrated in FIG. 3, one end of each TMR element 1 is electrically connected to a drain 1) of each transistor. T, respectively. The other end of each TMR element 1 is electrically connected to a bit line BL. The bit line BL is included in the upper interconnect UL (refer to FIG. 2). The gate of each transistor T is electrically connected to each word line WL respectively, and a source S of each transistor T is electrically connected to a source line SL. Each transistor T functions as the storage element of the MRAM 100. One transistor T and one transistor T electrically connected thereto constitute one memory cell.

When data is written into the memory cell of the MRAM 100, a selection voltage is applied to the word line WL that corresponds to the TMR element 1 of a write target. Then, in a state where this TMR element 1 is set to ON state, a voltage is applied between the bit line BL and the source line SL such that a current of which the polarity corresponds to the write data ("1" or "0") flows through the TMR element 1. The magnitude of the voltage applied at this point is set to a magnitude that may cause spin injection magnetization reversal in a magnetization free layer 7 (refer to FIG. 4) of the TMR element 1 as will be described later. Accordingly, the magnetization direction of the magnetization free layer 7 (refer to FIG. 4) of the TMR element 1 is set to a direction corresponding to the write data.

When data is read from the memory cells of the MRAM 100, a selection voltage is applied to the word line WL that corresponds to the TMR element 1 of a read target. Then, in a state where this TMR element 1 is set to ON state, a voltage that is smaller than the voltage at the time of writing is applied between the bit line BL and the source line SL. Accordingly, since a current of which the magnitude corresponds to data stored in the TMR element 1 flows between the bit line BL and the source line SL through the TMR element 1, the data is read by detecting the current value.

Figure 4:
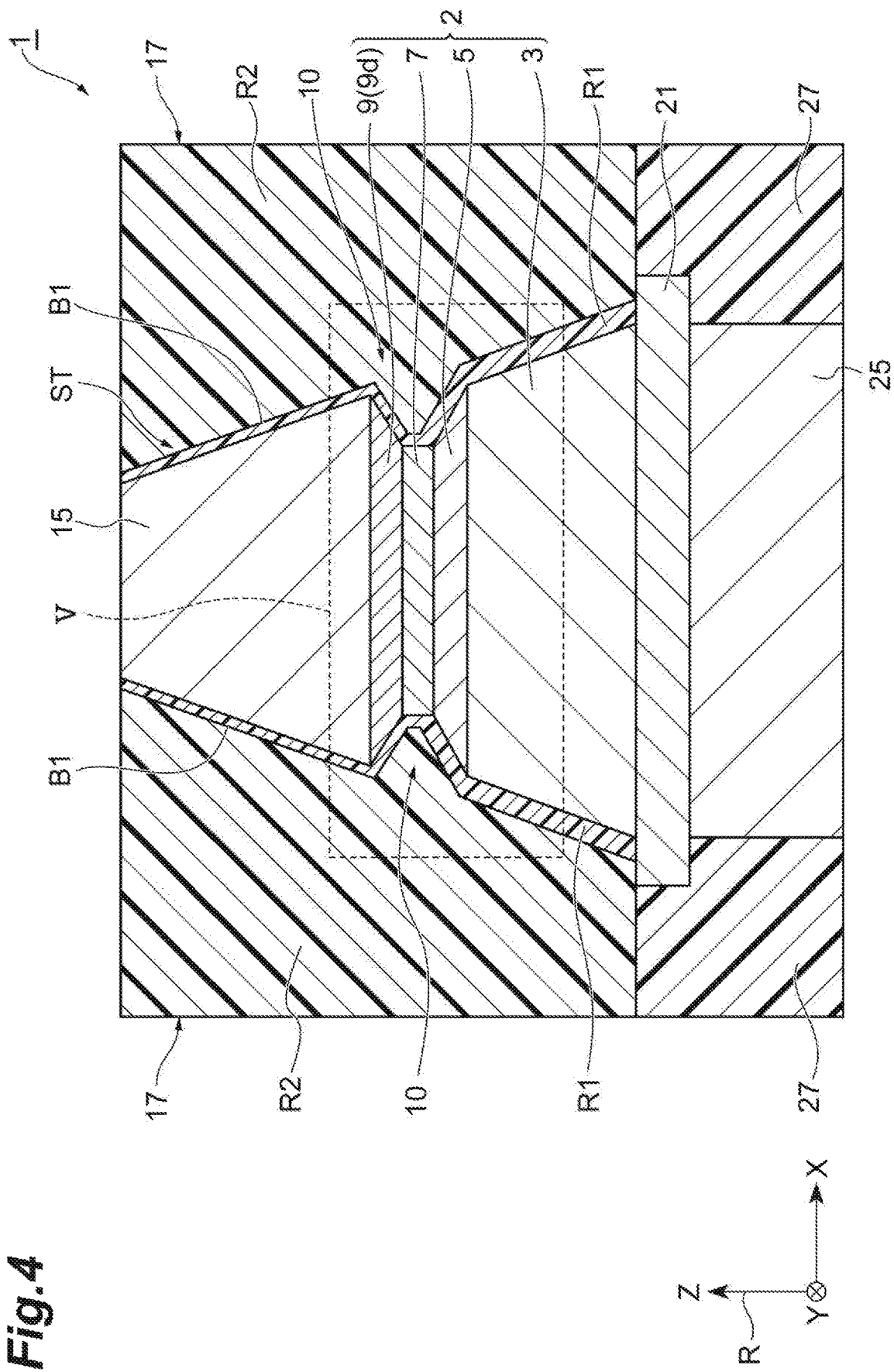
FIG. 4 is a cross-sectional view in the vicinity of the TMR element of the MRAM of the first embodiment.
Figure 5:
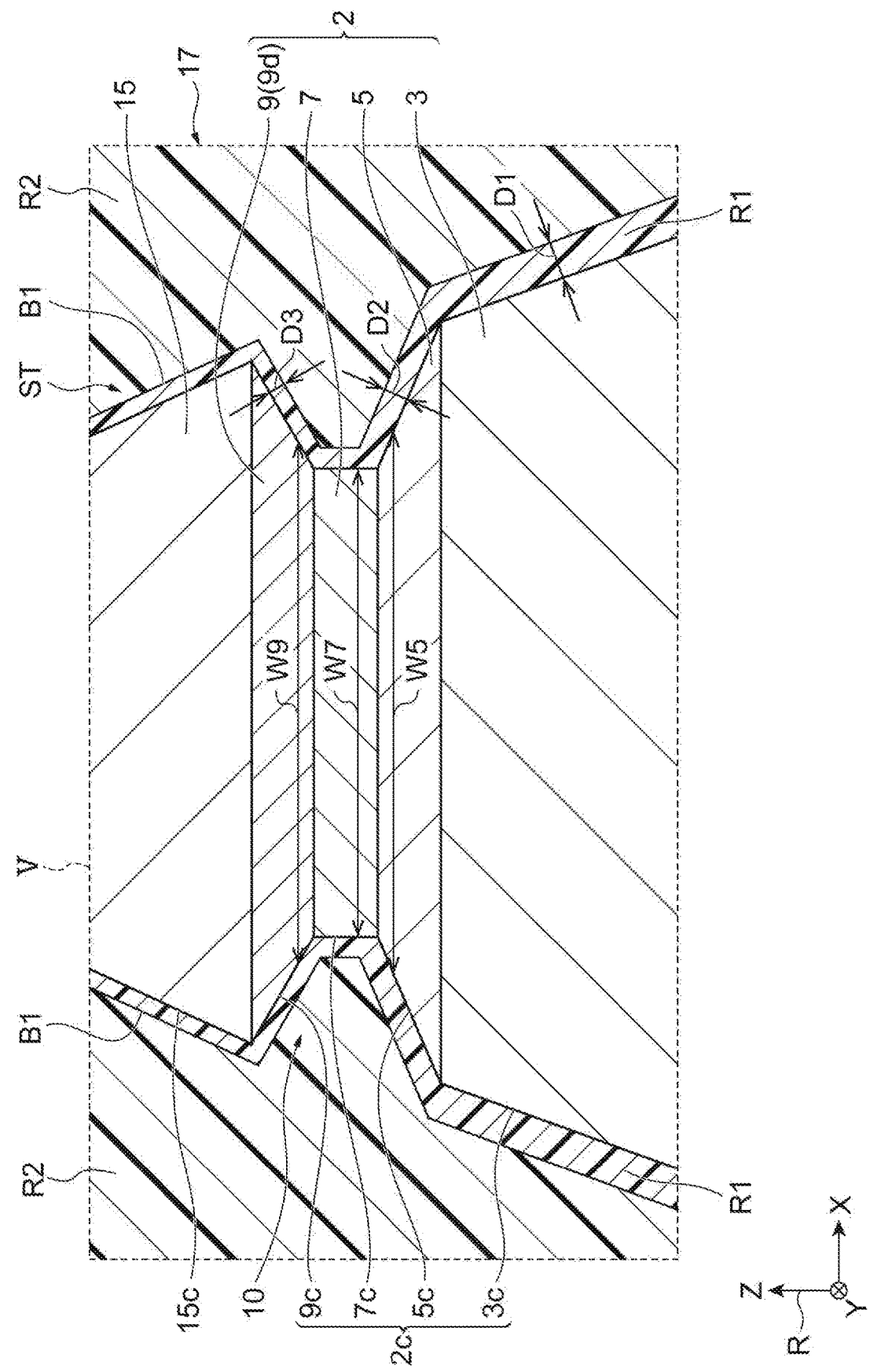
FIG. 5 is an enlarged view of a region V in FIG. 4.

Next, a detailed configuration of each TMR element 1 of the present embodiment will be described. FIG. 4 is a cross-sectional view in the vicinity of the TMR element of the MRAM of the present embodiment. FIG. 4 illustrates a cross-section in the vicinity of one TMR element 1 in the vertical cross-section of the MRAM 100 illustrated in FIG. 2. FIG. 5 is an enlarged view of a region V in FIG. 4.

As illustrated in FIG. 4 and FIG. 5, the TMR element 1 includes the stack portion ST and the side wall portion 17 that is disposed outside the stack portion ST. The stack portion ST is configured with a plurality of layers that are stacked along the Z-axis direction which is a stack direction. The stack portion ST, for example, includes a magnetic tunnel junction element unit 2 and a mask layer 15. The magnetic tunnel junction element unit 2 is disposed on a base layer 21 on the via interconnect part 25. The mask layer 15 is disposed on the magnetic tunnel junction element unit 2. The magnetic tunnel junction element unit 2 is configured by stacking a reference layer 3, a tunnel barrier layer 5, the magnetization free layer 7, and a cap layer 9 in this order. The reference layer 3 functions as a magnetization fixed layer. Thus, the tunnel barrier layer 5 is stacked along the Z-axis direction between the reference layer 3 and the magnetization free layer 7. The cap layer 9 is stacked on the side of the magnetization free layer 7 opposite to the tunnel barrier layer 5 side. In the TMR element 1, the magnetization direction of the magnetization free layer 7 can be reversed using a spin-polarized current that flows through the magnetization free layer 7 via the tunnel barrier layer 5. The magnetization direction of the reference layer 3 is substantially fixed along the stack direction. The cap layer 9 can include a perpendicular magnetization inducing layer $9d$. The perpendicular magnetization inducing layer $9d$ imparts magnetic anisotropy along the stack direction to the magnetization free layer 7.

For example, the magnetic tunnel junction element unit 2 includes a recess 10 outside the tunnel barrier layer 5, the magnetization free layer 7, and the cap layer 9. In the magnetic tunnel junction element unit 2, for example, a side surface $5c$ of the tunnel barrier layer 5 can have an inclination such that a width W5 of the tunnel barrier layer 5 is monotonously decreased along a direction from a boundary between the reference layer 3 and the tunnel barrier layer 5 toward a boundary between the tunnel barrier layer 5 and the magnetization free layer 7. The magnetization free layer 7 can have a width W7 that is smaller than the width W5 of the tunnel barrier layer 5.

In the magnetic tunnel junction element unit 2, for example, a side surface $9c$ of the cap layer 9 can have an inclination such that a width W9 of the cap layer 9 is monotonously decreased along a direction from a boundary between the mask layer 15 and the cap layer 9 toward a boundary between the cap layer 9 and the magnetization free layer 7. The magnetization free layer 7 has the width W7 that is smaller than the width W9 of the cap layer 9.

In the tunnel barrier layer 5 and the cap layer 9, while each of the side surface $5c$ and the side surface $9c$ can have an almost linear inclination such that the width W5 of the tunnel barrier layer 5 and the width W9 of the cap layer 9 are monotonously changed, each of the side surface $5c$ and the side surface $9c$ may have an inclination other than such a linear inclination. Each of the side surface $5c$ and the side surface $9c$, for example, may have a curved inclination, or may have a protrusion or a depression thereon.

In the stack portion ST, the via interconnect part 25 is formed of a conductive material. The via interconnect part 25 is, for example, formed of a metal such as Cu. The base layer 21 is formed of a conductive material. For example, the base layer 21 is formed of a conductive oxide, a conductive nitride, a conductive oxynitride, or a silicide. Thus, the lower surface of a reference layer 3 that is one end of the TMR element 1 of the present embodiment is electrically connected to the drain D (refer to FIG. 3) of the transistor T through the base layer 21 and the via interconnect part 25.

The base layer 21 is disposed in order to improve the flatness of each layer of the stack portion ST, particularly, the tunnel barrier layer 5. Thus, the flatness of the upper surface of the base layer 21 is set to be higher than the flatness of the upper surface of the via interconnect part 25. The upper surface of the base layer 21 has high flatness and extends along the XY plane. The stack portion ST is formed on the upper surface of the base layer 21. The via interconnect part 25 and the base layer 21 are embedded in the interlayer insulation layer 27 and, by the interlayer insulation layer 27, are electrically insulated from the via interconnect parts and the base layers that are electrically connected to the other TMR elements 1.

The reference layer 3 is formed of a ferromagnetic material such as Co, a Co—Fe alloy, or a Co—Fe—B alloy. The magnetization direction of the reference layer 3 is substantially fixed along the Z-axis direction. The thickness in the Z-axis direction of the reference layer 3 can be, for example, greater than or equal to 3 nm and less than or equal to 10 nm. In addition, the reference layer 3 can have a structure in which a multilayer film such as Co/Pt or Co/Ni is repeatedly stacked such that the magnetization direction of each magnetic layer is in a perpendicular direction, Furthermore, the reference layer 3 can have a structure in which magnetic fields that occur in the reference layer 3 offset each other using the RKKY interaction that occurs through a thin film of Ru, Ir, or the like. This structure is a synthetic anti-ferromagnet (SAF) structure, that is, a structure that includes two ferromagnetic layers formed of a ferromagnetic material and a non-magnetic layer stacked between the two ferromagnetic layers in which the magnetization directions of the two ferromagnetic layers are coupled to each other through the non-magnetic layer in antiparallel by exchange coupling that is based on the RKKY interaction.

The tunnel barrier layer 5 is formed of an insulation material. The tunnel barrier layer 5 is preferably con figured to induce perpendicular magnetic anisotropy in the magnetization free layer 7 based on the same principle as the cap layer 9 described later. The reason is that the perpendicular magnetization of the magnetization free layer 7 is more stable, and the film thickness of the magnetization free layer 7 can be increased. The material constituting the tunnel barrier layer 5 that may induce perpendicular magnetic anisotropy in the magnetization free layer 7 can be exemplified, for example, by MgO, ZnO, $GaO_x$, or an oxide material that has a spinel structure represented by General Formula $AB_2O_4$ (in the formula, A is at least one kind of chemical element selected from a group consisting of Mg and Zn, and. B is at least one kind of chemical element selected from a group consisting of Al, Ga, and In).

The tunnel barrier layer 5 may be configured not to induce perpendicular magnetic anisotropy in the magnetization free layer 7. In this case, the tunnel barrier layer 5 can be formed of $AlN_x$, $Cu(In_{0.8}Ga_{0.2})Se_2$, or the like.

The thickness in the Z-axis direction of the tunnel barrier layer 5 is small enough such that a tunnel current flows through the tunnel barrier layer 5 in the Z-axis direction when a voltage is applied between the reference layer 3 and the magnetization free layer 7. The thickness in the Z-axis direction of the tunnel barrier layer 5 can be, for example, greater than or equal to 1 nm and less than or equal to 3 nm.

In addition, in the present embodiment, the tunnel barrier layer 5 is formed of a material that induces magnetic anisotropy (perpendicular magnetic anisotropy) in the Z-axis direction in a region of the magnetization free layer 7 in the vicinity of the interface between the magnetization free layer 7 and the tunnel barrier layer 5. Accordingly, the tunnel barrier layer 5 imparts magnetic anisotropy in a direction (perpendicular direction) along the Z axis to the magnetization free layer 7 in cooperation with the cap layer 9 described later. When the easy magnetization axis of the magnetization free layer 7 can be sufficiently stably directed in the direction along the Z axis by the action and the like of the cap layer 9, the tunnel barrier layer 5 may be formed of a material that does not induce perpendicular magnetic anisotropy in the magnetization free layer 7.

The magnetization free layer 7 is formed of a ferromagnetic material such as Fe, Co—Fe, Co—Fe—B, or a ferromagnetic Heusler alloy. The magnetization direction of the magnetization free layer 7 is substantially not fixed.

The perpendicular magnetization inducing layer 9d is formed of, for example, MgO, ZnO, $Ga_2O_3$, or an oxide material that has a spinel structure represented by General Formula $AB_2O_4$ (in the formula, A is at least one kind of chemical element selected from a group consisting of Mg and Zn, and B is at least one kind of chemical element selected from a group consisting of Al, Ga, and In).

The perpendicular magnetization inducing layer 9d is preferably configured such that the resistance value of the perpendicular magnetization inducing layer 9 along the Z-axis direction per unit area in the XY plane is smaller than that of the tunnel barrier layer 5. Particularly, when the cap layer 9 is formed of an insulation material, the thickness in the Z-axis direction of the cap layer 9 is preferably smaller than the thickness in the Z-axis direction of the tunnel barrier layer 5.

The perpendicular magnetization inducing layer 9d is formed of a material that induces magnetic anisotropy (perpendicular magnetic anisotropy) in the direction along the Z axis in a region of the magnetization free layer 7 in the vicinity of the interface between the magnetization free layer 7 and the cap layer 9 based on the spin-orbit interaction. Accordingly, the cap layer 9 imparts magnetic anisotropy in the direction (perpendicular direction) along the Z axis to the magnetization free layer 7 in cooperation with the tunnel barrier layer 5.

The cap layer 9 may not include the perpendicular magnetization inducing layer 9d. In this case, the magnetization direction of the reference layer 3 may be fixed in a direction (in-plane direction; that is, a direction parallel to the XY plane) that intersects with the stack direction, and the easy magnetization axis of the magnetization free layer 7 may be set in the in-plane direction.

The thickness of the magnetization free layer 7 in the Z-axis direction is small enough such that the easy magnetization axis of the magnetization free layer 7 is stably set in the direction along the Z axis by the function of imparting magnetic anisotropy exhibited by the tunnel barrier layer 5 and the perpendicular magnetization inducing layer 9d as described above. The thickness can be, for example, greater than or equal to 1 nm and less than or equal to 3 nm.

The mask layer 15 is stacked on the perpendicular magnetization inducing layer 9d. The mask layer 15 is formed of a conductive material formed of, for example, a metal such as Ta, Ru, W, TaN, TiN, or CuN. The upper surface of the mask layer 15, which is the other end of the TMR element 1 of the present embodiment, is electrically connected to the bit line BL (refer to FIG. 3).

The side wall portion 17 is formed of an insulation material and covers the side surface of the stack portion ST. Accordingly, the side wall portion 17 electrically insulates the stack portion ST of the TMR element 1 from the stack portions of the other TMR elements. The side wall portion 17 is formed of, for example, a nitride material such as SiN, or an oxynitride material such as SiON.

The side wall portion 17 includes a first region R1 that is formed of an insulation material. The first region R1 covers at least a part of a side surface 2c of the magnetic tunnel junction element unit 2, that is, at least one of a side surface 3c of the reference layer 3, the side surface 5c of the tunnel barrier layer 5, a side surface 7c of the magnetization free layer 7, and the side surface 9c of the cap layer 9. The first region R1 may cover the whole side surface 2c of the magnetic tunnel junction element unit 2, or may cover only a part of the side surface 2c of the magnetic tunnel junction element unit 2. The first region R1 may cover at least a part of the side surface 2c of the magnetic tunnel junction element unit 2 and a side surface 15c of the mask layer 15. The first region R1 may cover the whole side surface 2c of the magnetic tunnel junction element unit 2 and the side surface 15e of the mask layer 15.

The first region R1 that is formed of an insulation material can be in contact with at least a part of the side surface 2c of the magnetic tunnel junction element unit 2, that is, at least one side surface of the side surface 3c of the reference layer 3, the side surface 5c of the tunnel barrier layer 5, the side surface 7c of the magnetization free layer 7, and the side surface 9c of the cap layer 9. The first region R1 can be in contact with the whole side surface 2c of the magnetic tunnel junction element unit 2, or can be in contact with only a part of the side surface 2c of the magnetic tunnel junction element unit 2. The first region R1 can be in contact with at least a part of the side surface 2c of the magnetic tunnel junction element unit 2 and the side surface 15c of the mask layer 15. The first region R1 can be in contact with the whole side surface 2c of the magnetic tunnel junction element unit 2 and the side surface 15c of the mask layer 15. The first region R1 preferably extends along a part or whole side surface 2c of the magnetic tunnel junction element unit 2.

The first region R1 that is formed of an insulation material includes, as a contained chemical element, at least one of chemical elements (except oxygen) constituting the reference layer 3, the tunnel barrier layer 5, the magnetization free layer 7, and the cap layer 9 that the first region R1 covers or is in contact with. The first region R1, for example, includes at least one of the chemical elements in the form of a single body of at least one of the chemical elements, an alloy including at least one of the chemical elements, an oxide, a nitride, or an oxynitride of the single body, or an oxide, a nitride, or an oxynitride of the alloy. When layers that the first region R1 covers or is, for example, in contact with is a CoFe layer and an MgO layer, the first region R1 is formed of a single body of at least one chemical element of Co, Fe and Mg, an alloy including the chemical element, an oxide, a nitride, or an oxynitride of the single body, or an oxide, a nitride, or an oxynitride of the alloy. The first region R1 preferably includes, as the above contained chemical element, at least one of a metal chemical element or a semiconductor chemical element among the chemical elements constituting the reference layer 3, the tunnel barrier layer 5, the magnetization free layer 7, and the cap layer 9 that the first region R1 covers or is in contact with.

The first region R1 that is formed of an insulation material preferably includes a main component of at least one of the reference layer 3, the tunnel barrier layer 5, the magnetization free layer 7, and the cap layer 9, which are in contact with the first region R1. The first region R1 further preferably includes a chemical element included in at least one of the reference layer 3, the tunnel barrier layer 5, the magnetization free layer 7, and the cap layer 9, which are in contact with the first region R1, as a main component. In addition, the first region R1 further preferably includes a main component of at least one of the reference layer 3, the tunnel barrier layer 5, the magnetization free layer 7, and the cap layer 9, which are in contact with the first region R1, as a main component. In such cases, as will be described later, the effect of the first region R1 suppressing the movement of the chemical elements constituting the reference layer 3, the tunnel barrier layer 5, the magnetization free layer 7, and the cap layer 9 to the side wall portion 17 is more effectively exhibited. The main component means a component that is included at the highest atomic ratio among components included in the reference layer 3, the tunnel barrier layer 5, the magnetization free layer 7, and the cap layer 9.

In the TMR element 1, when at least one of the reference layer 3, the tunnel barrier layer 5, the magnetization free layer 7, and the cap layer 9, which are in contact with the first region R1, includes at least one chemical element of Co, Fe, and Ta as a contained chemical element, the first region R1 preferably includes a nitride that includes the at least one chemical element as a contained chemical element.

In the TMR element 1, when at least one of the reference layer 3, the tunnel barrier layer 5, the magnetization free layer 7, and the cap layer 9, which are in contact with the first region R1, includes at least one chemical element of B, Al, and Si, the first region R1 preferably includes a nitride that includes the at least one chemical element as a contained chemical element.

In the present embodiment, the side wall portion 17 can be formed of an insulation material and include a second region R2 that covers an outer periphery B1 of the first region R1. The first region R1 is positioned between the magnetic tunnel junction element unit 2 and the second region. R2. When the first region R1 further covers the side surface 15c of the mask layer 15, the first region R1 can be positioned between the mask layer 15 and the second region R2. When the first region R1 is in contact with only a part of the side surface, the first region R1 can include a chemical element of the layer in contact with the first region R1 as a contained chemical element. At this point, the movement of the chemical element from the magnetic tunnel junction element unit 2 is reduced. The second region R2 that is, for example, formed of an insulation material includes a nitride that includes at least one of B, Al, and Si as a contained chemical element.

In the TMR element 1, a distance Di from the outer periphery B1 of the first region R1 to the side surface 3c of the reference layer 3 can be greater than or equal to 3 nm. That is, the minimum distance from the outer periphery B1 of the first region R1 to the side surface 3c of the reference layer 3 can be greater than or equal to 3 nm. More preferably, the distance D1 can be greater than or equal to 5 nm. The outer periphery B1 of the first region R1 is, for example, a boundary between the first region R1 and the second region R2.

A distance D2 from the outer periphery B1 of the first region R1 to the side surface 5c of the tunnel barrier layer 5 can be greater than a distance 133 from the outer periphery B1 of the first region R1 to the side surface 9c of the cap layer 9. That is, the minimum distance from the outer periphery B1 of the first region R1 to the side surface 5c of the tunnel barrier layer 5 can be greater than the minimum distance from the outer periphery B1 of the first region R1 to the side surface 9c of the cap layer 9.

In the TMR element 1, as described above, since the easy magnetization axis of the magnetization free layer 7 is set in the direction along the Z axis, and the magnetization direction of the reference layer 3 is substantially fixed in the Z-axis direction, the magnetization direction of the reference layer 3 is parallel or antiparallel to the magnetization direction of the magnetization free layer 7 when the magnetization free layer 7 is not substantially affected by an external magnetic field or an STT. The stack portion ST in a state where the magnetization directions of the reference layer 3 and the magnetization free layer 7 are parallel to each other has a different electrical resistance value in the Z-axis direction from that of the stack portion ST in a state where the magnetization directions of the reference layer 3 and the magnetization free layer 7 are antiparallel to each other. Thus, these two states respectively correspond to "1" and "0" that are data of the memory cell of the MRAM 100.

The magnetization direction of the magnetization free layer 7 is reversed (that is, data is written into the memory cell in the MRAM 100) by spin injection magnetization reversal. Specifically, when the magnetization direction of the magnetization free layer 7 is reversed to a parallel state from an antiparallel state with respect to the magnetization direction of the reference layer 3, a voltage is applied between one end and the other end in the Z-axis direction of the stack portion ST such that the tunnel current flows through the tunnel barrier layer 5 in a direction from the magnetization free layer 7 toward the reference layer 3 (that is, spin-polarized electrons move toward the magnetization free layer 7 from the reference layer 3). Accordingly, from the spin-polarized electrons, the magnetization free layer 7 receives a spin transfer torque in a direction in which the magnetization direction of the magnetization free layer 7 rotates toward a parallel state from an antiparallel state with respect to the magnetization direction of the reference layer 3. The magnetization direction of the magnetization free layer 7 is reversed by setting the magnitude of the voltage to be higher than or equal to the threshold that causes spin injection magnetization reversal.

Conversely, when the magnetization direction of the magnetization free layer 7 is reversed to an antiparallel state from a parallel state with respect to the magnetization direction of the reference layer 3, a voltage is applied between one end and the other end in the Z-axis direction of the stack portion ST such that the tunnel current flows through the tunnel barrier layer 5 in a direction from the reference layer 3 toward the magnetization free layer 7 (that is, spin-polarized electrons move toward the reference layer 3 from the magnetization free layer 7). Accordingly, from the spin-polarized electrons, the magnetization free layer 7 receives a spin transfer torque in a direction in which the magnetization direction of the magnetization free layer 7 rotates toward an antiparallel state from a parallel state with respect to the magnetization direction of the reference layer 3. The magnetization direction of the magnetization free layer 7 is reversed by setting the magnitude of the voltage to be higher than or equal to the threshold that causes spin injection magnetization reversal.

In the TMR element 1 according to the present embodiment, the side surface 2c of the magnetic tunnel junction element unit 2 is covered with the first region R1 that is formed of an insulation material. Since the first region R1 includes, as a contained chemical element, the chemical element constituting the layer of the magnetic tunnel junction element unit 2 that is in contact with the first region R1, entropy related to the contained chemical element in the layer in contact and the first region R1 is increased, compared to that when only a chemical element different from the chemical element constituting the layer in contact is present in the first region R1. Thus, the chemical element constituting the layer in contact with the first region R1 does not easily diffuse thermodynamically toward the first region R1 from the layer in contact, compared to that when only the chemical element different from the chemical element constituting the layer in contact is present in the first region R1 Consequently, even when the magnetic tunnel junction element unit 2 is annealed under a high temperature atmosphere at the time of manufacturing the TMR element 1, the movement of the chemical element to the side wall portion 17 is reduced. Since a change in the composition of the chemical element constituting the magnetic tunnel junction element unit 2 is suppressed, the TMR element 1 can maintain a predetermined characteristic such as a high MR ratio.

Furthermore, in the TMR element 1 according to the present embodiment, the side wall portion 17 can be formed of an insulation material and include the second region R2 that covers the outer periphery B1 of the first region R1. The first region R1 can be positioned between the magnetic tunnel junction element unit 2 and the second region R2. Accordingly, since the second region R2 that is formed of an insulation material is disposed in the side wall portion 17, the insulation properties of the side wall portion 17 are further improved.

Furthermore, in the TMR element 1 according to the present embodiment, the first region includes a nitride that includes at least one of B, Al, and Si as a contained chemical element, and the second region includes a nitride that includes at least one of B, Al, and Si as a contained chemical element. Accordingly, the first region R1 and the second region R2 have high insulation properties. In addition, when at least one of the reference layer 3, the tunnel barrier layer 5, the magnetization free layer 7, and the cap layer 9, which are in contact with the first region R1 includes, for example, at least one of B, Al, and Si, the TMR element 1 can reduce the movement of the chemical element. That is, since a nitride that includes at least one of B, Al, and Si is unlikely to diffuse between the magnetic tunnel junction element unit 2 and the side wall portion 17 even after the annealing step for the magnetic tunnel junction element unit 2, a change in the element resistance of the TMR element 1 before and after the annealing step is reduced. The first region R1 and the second region R2 can particularly effectively reduce a change in the element resistance of the TMR element 1 when each layer included in the magnetic tunnel junction element unit 2 includes a chemical element such as 13, Al, and Si.

Furthermore, in the TMR element 1 according to the present embodiment, the distance D1 from the outer periphery B1 of the first region R1 to the side surface 3c of the reference layer 3 can be greater than or equal to 3 nm. Accordingly, by the annealing of the magnetic tunnel junction element unit 2 under the high temperature atmosphere of 400 degrees Celsius, the movement of the chemical element constituting the reference layer 3 of the magnetic tunnel junction element unit 2 to the side wall portion 17 is particularly reduced. A decrease in 15 magnetic characteristics in the TMR element 1 is suppressed. When the distance D1 is greater than or equal to 5 nm, the movement of the chemical element constituting the magnetic tunnel junction element unit 2 to the side wall portion 17 is further reduced.

Furthermore, in the TMR element according to the present embodiment, the distance from the outer periphery B1 of the first region R1 to the side surface 5c of the tunnel barrier layer 5 can be greater than the distance from the outer periphery B1 of the first region R1 to the side surface 9c of the cap layer 9. Accordingly, the movement of the chemical element of the tunnel barrier layer 5 that significantly affects the characteristics of the TMR element is particularly reduced.

Furthermore, in the TMR element 1 according to the present embodiment, the first region. R1 can include a nitride that includes at least one of Co, Fe, and Ta as a contained chemical element. Accordingly, when at least one of the reference layer 3, the tunnel barrier layer 5, the magnetization free layer 7, or the cap layer 9, which is in contact with the first region R1, for example, includes at least one of Co, Fe, and Ta, the TMR element 1 can effectively reduce the movement of the chemical element. That is, since the first region includes a chemical element such as Co, Fe, and Ta that move particularly easily, the movement of the chemical element at the time of annealing is prevented by the first region. Thus, the effect of the present disclosure of reducing the movement of the chemical element constituting the magnetic tunnel junction element unit to the side wall portion is particularly effectively exhibited.

Furthermore, in the TMR element 1 according to the present embodiment, the cap layer 9 can include the perpendicular magnetization inducing layer 9d, and the perpendicular magnetization inducing layer 9d can impart magnetic anisotropy in the stack direction to the magnetization free layer 7.

In the TMR element 1 according to the present embodiment, the tunnel barrier layer 5 is formed of an oxide material that has a spinel structure which is a crystal structure replaceable with various chemical elements. Since the material can particularly effectively impart magnetic anisotropy in the stack direction to the magnetization free layer 7, the direction of the easy magnetization axis of the magnetization free layer 7 can be particularly stably set in the perpendicular direction.

A specific example of a manufacturing method for such a TMR element of the present embodiment will be described. FIG. 6 to FIG. 16 are views illustrating a cross-section for describing the specific example of the manufacturing method for the TMR element of the present embodiment. Each of FIG. 6 to FIG. 16 corresponds to the above cross-section in the vicinity of the above TMR element illustrated in FIG. 4.

Figure 6:
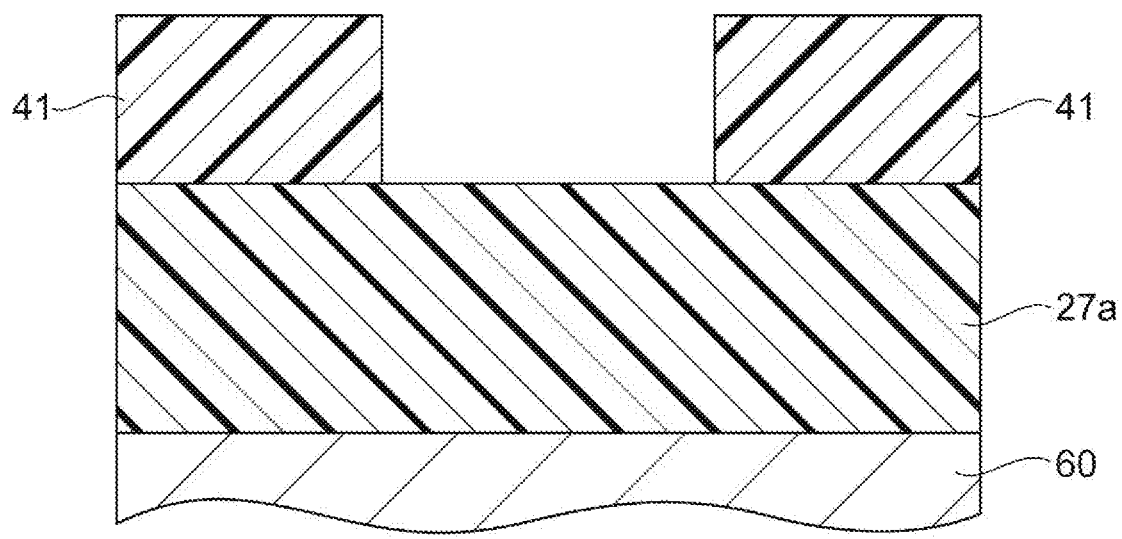
FIG. 6 is a view illustrating a cross-section for describing a specific example of a manufacturing method for the TMR element of the first embodiment.

In the specific example of the manufacturing method, first, as illustrated in FIG. 6, a lower interlayer insulation layer 27a is formed on the whole surface on the transistor array 60. Then, a resist 41 that has an opening is formed on the lower interlayer insulation layer 27a. The lower interlayer insulation layer 27a is formed of the same material as the interlayer insulation layer 27. The opening of the resist 41 corresponds to a region in which the via interconnect part 25 described later is formed.

Next, as illustrated in FIG. 7, the lower interlayer insulation layer 27a is etched by dry etching such as reactive ion etching (RIE) using the resist 41 as a mask. Then, an opening that has a depth reaching the transistor array 60 is formed in the lower interlayer insulation layer 27a by removing the resist 41.

Next, as illustrated in FIG. 8, the via interconnect part 25 that is formed of a metal such as Cu is formed such that the opening of the lower interlayer insulation layer 27a is embedded. Then, the base layer 21 that is formed of a conductive material is formed on the via interconnect part 25 and the lower interlayer insulation layer 27a. A base layer that is formed of a conductive material such as Ta may be formed on the side surface of the opening of the lower interlayer insulation layer 27a before the via interconnect part 25 is formed.

Next, as illustrated in FIG. 9, a resist 43 is formed on the base layer 21. The resist 43 is formed at a position that is above the whole via interconnect part 25 and a part of the lower interlayer insulation layer 27a in the perpendicular direction, and is not formed at a position that is above, in the perpendicular direction, a region in which an upper interlayer insulation layer 27b described later is formed.

Next, as illustrated in FIG. 10, the base layer 21 is selectively etched by dry etching such as reactive ion etching (RIE) using the resist 43 as a mask. Then, the upper interlayer insulation layer 27b is formed in the etched region. Then, the resist 43 is removed. Then, the surface of each of the base layer 21 and the upper interlayer insulation layer 27b is flattened by polishing such as chemical mechanical polishing (CMP). Accordingly, the flatness of the upper surface of the base layer 21 is higher than the flatness of the upper surface of the via interconnect part 25. The upper interlayer insulation layer 27b is formed of the same material as the interlayer insulation layer 27. The lower interlayer insulation layer 27a and the upper interlayer insulation layer 27b constitute the interlayer insulation layer 27.

Figure 11:
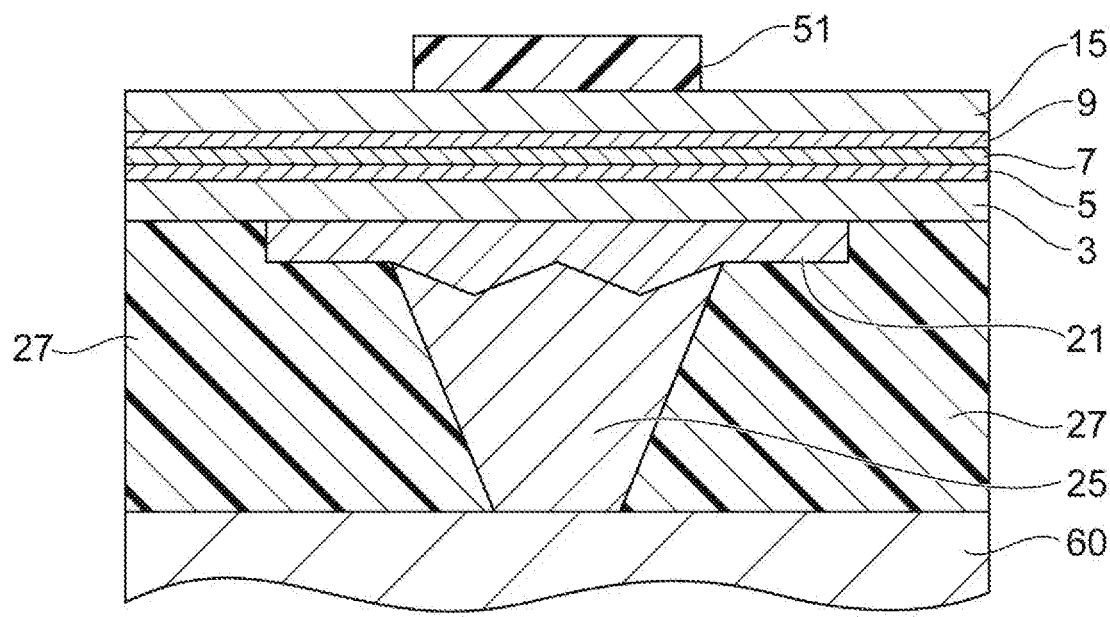
FIG. 11 is a view illustrating a cross-section for describing the specific example of the manufacturing method for the TMR element of the first embodiment.

Next, as illustrated in FIG. 11, a magnetoresistive stack film 4 in which the reference layer 3, the tunnel barrier layer 5, the magnetization free layer 7, and the cap layer 9 (perpendicular magnetization inducing layer 9d) are stacked in this order is formed on the whole surface on the base layer 21 and the interlayer insulation layer 27, and the mask layer 15 is formed on the magnetoresistive stack film 4. Then, a resist 51 is formed on a part of the surface of the mask layer 15. The resist 51 is formed at a position that is above the via interconnect part 25 in the perpendicular direction and above a part of the base layer 21 in the perpendicular direction. When necessary, a seed layer that is formed of a conductive material such as Ta and covers the whole surface on the base layer 21 and the interlayer insulation layer 27 may be formed between the base layer 21 and the interlayer insulation layer 27, and the reference layer 3.

Figure 12:
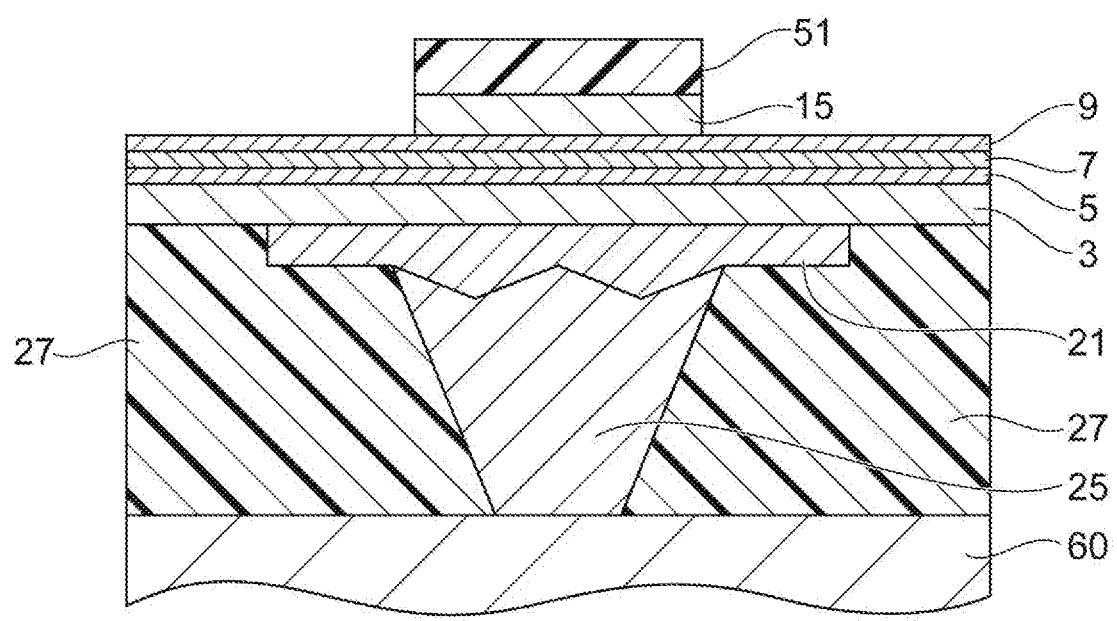
FIG. 12 is a view illustrating a cross-section for describing the specific example of the manufacturing method for the TMR element of the first embodiment.

Next, as illustrated in FIG. 12, the mask layer 15 is selectively etched by dry etching such as RIE using the resist 51 as a mask, and the surface of the perpendicular magnetization inducing layer 9d is exposed.

Next, as illustrated in FIG. 13, the resist 51 is removed. Then, the perpendicular magnetization inducing layer 9d, the magnetization free layer 7, the tunnel barrier layer 5, and the reference layer 3 are etched by dry etching such as RIB using the mask layer 15 as a mask. The etching is stopped when the base layer 21 and the interlayer insulation layer 27 are exposed. The magnetic tunnel junction element unit 2 that extends in the stack direction is formed.

Next, as illustrated in FIG. 14, the side surface of the magnetization free layer 7 is etched by dry etching, specifically, any one method of ion beam etching UBE) or RIE, or both methods. When using the IBE, the side surface of the magnetization free layer 7 is, for example, irradiated with an ion beam of a noble gas such as argon, krypton, or xenon. The irradiation direction of the ion beam, for example, has an angle of 10 to 25 degrees with respect to the in-plane direction of the magnetization free layer 7. In the present embodiment, while the side surface of the magnetization free layer 7 is irradiated with the ion beam, the width of the ion beam is greater than the thickness of the magnetization free layer 7. Thus, the side surface of each of the perpendicular magnetization inducing layer 9d and the tunnel barrier layer 5 is also etched. Consequently, the width of each of the perpendicular magnetization inducing layer 9d and the tunnel barrier layer 5 can be decreased in a direction approaching to the magnetization free layer 7. The hardness of the magnetization free layer 7 is, for example, lower than the hardness of each of the perpendicular magnetization inducing layer 9d and the tunnel barrier layer 5. Since the mask layer 15 includes a heavy metal of atomic number 72 or greater such as hafnium (Hf) and Ta, the etching of the mask layer 15 is suppressed.

Next, as illustrated in FIG. 15, the first region R1 that covers the side surface 2c of the magnetic tunnel junction element unit 2 is formed using a method such as ion beam deposition (IBD) or sputtering. When at least one of the reference layer 3, the tunnel barrier layer 5, the magnetization free layer 7, or the cap layer 9, which is in contact with the first region R1, for example, includes at least one of B, Al, and Si, the first region R1 includes at least one of B, Al, and Si as a contained chemical element. For example, when at least one of the reference layer 3, the tunnel barrier layer 5, the magnetization free layer 7, and the cap layer 9 in contact with the first region R1 includes a nitride that includes at least one of Co, Fe, and Ta as a contained chemical element, the first region R1 is formed such that the first region R1 includes a nitride that includes at least one of Co, Fe, and Ta as a contained chemical element.

Then, the first region R1 is processed by dry etching such as IBE. In the dry etching, for example, the first region. R1 is processed such that the distance D1 from the outer periphery B1 to the side surface 3c of the reference layer 3 is greater than or equal to 3 nm. In addition, the first region R1 is, for example, processed such that the distance D2 from the outer periphery B1 to the side surface 5c of the tunnel barrier layer 5 is greater than the distance D3 from the outer periphery B1 of the first region R1 to the side surface 9c of the cap layer 9.

Next, as illustrated in FIG. 16, the second region R2 that covers the outer periphery B1 of the first region R1 is disposed, and the side wall portion 17 is formed. The second region R2 is disposed by atomic layer deposition (ALD) or sputtering. The second region R2 is, for example, formed of an insulation material and includes a nitride that includes at least one of B, Al, and Si. The first region R1 is positioned between the magnetic tunnel junction element unit 2 and the second region R2. The first region R1 can cover the side surface 15c of the mask layer 15 and can be positioned between the mask layer 15 and the second region R2. In the present specific example, the TMR element 1 is fabricated by further forming an upper electrode layer 31 on the mask layer 15 and the side wall portion 17.

According to the method of manufacturing the TMR element according to the present embodiment, the first region R1 that includes the chemical element constituting the magnetic tunnel junction element unit 2 as a contained chemical element is formed. Since the first region R1 covers the side surface 2c of the magnetic tunnel junction element unit 2, the first region R1 reduces the movement of the chemical element constituting the layer of the magnetic tunnel junction element unit 2 in contact with the first region R1 to the side wall portion 17 even when the magnetic tunnel junction element unit 2 is annealed under the high temperature atmosphere at the time of manufacturing the TMR element 1. Since a change in the composition of the chemical element constituting the magnetic tunnel junction element unit 2 is suppressed even after the magnetic tunnel junction element unit 2 is annealed, the TMR element 1 can maintain a predetermined characteristic that is a high MR ratio.

(Second Embodiment)

Figure 17:
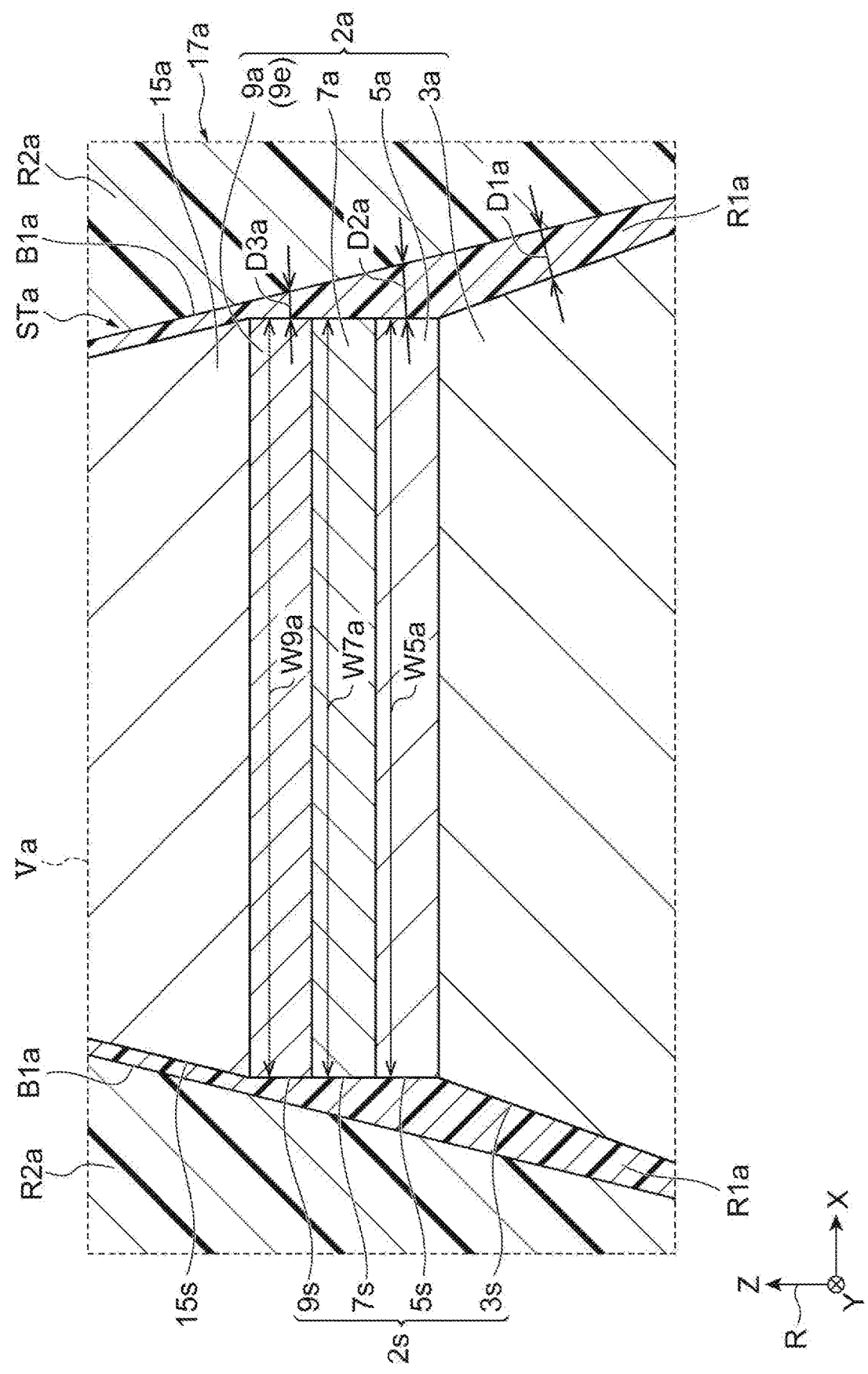
FIG. 17 is an enlarged view of a cross-section in the vicinity of a TMR element according to a second embodiment.

FIG. 17 is an enlarged view of a cross-section in the vicinity of a TMR element according to a second embodiment. FIG. 17 illustrates a region Va that corresponds to FIG. 5 in the first embodiment. A TMR element 1a of the second embodiment has the same configuration as the TMR element 1 of the first embodiment except for the configuration of the region Va.

As illustrated in FIG. 17, the TMR element 1a includes a stack portion STa and a side wall portion 17a that is disposed outside the stack portion STa. The stack portion STa, for example, includes a magnetic tunnel junction element unit 2a and a mask layer 15a. The magnetic tunnel junction element unit 2a is disposed on the base layer 21. The mask layer 15a is disposed on the magnetic tunnel junction element unit 2a. The magnetic tunnel junction element unit 2a is configured by stacking the reference layer 3a, a tunnel barrier layer 5a, a magnetization free layer 7a, and a cap layer 9a in this order. The reference layer 3a functions as a magnetization fixed layer. The magnetization direction of the reference layer 3a is substantially fixed along the stack direction. The cap layer 9a can include a perpendicular magnetization inducing layer 9e. The perpendicular magnetization inducing layer 9e imparts magnetic anisotropy along the stack direction to the magnetization free layer 7a.

In the magnetic tunnel junction element unit 2a, the tunnel barrier layer 5a, the magnetization free layer 7a, and the cap layer 9a can have almost the same width. A width W7a of the magnetization free layer 7a can be greater than a width W9a of the cap layer 9a. A width W5a of the tunnel barrier layer 5a can be greater than the width W7a of the magnetization free layer 7a.

In the TMR element 1a, a distance D1a from an outer periphery B1a of a first region R1a to a side surface 3s of the reference layer 3a can be greater than or equal to 3 nm. More preferably, the distance D1a can be greater than or equal to 5 nm. A distance D2a from the outer periphery B1a of the first region R1a to a side surface 5s of the tunnel barrier layer 5a can be greater than a distance D1a from an interface B2a between the first region R1a and a second region R2a to a side surface 9s of the cap layer 9a.

Figure 18:
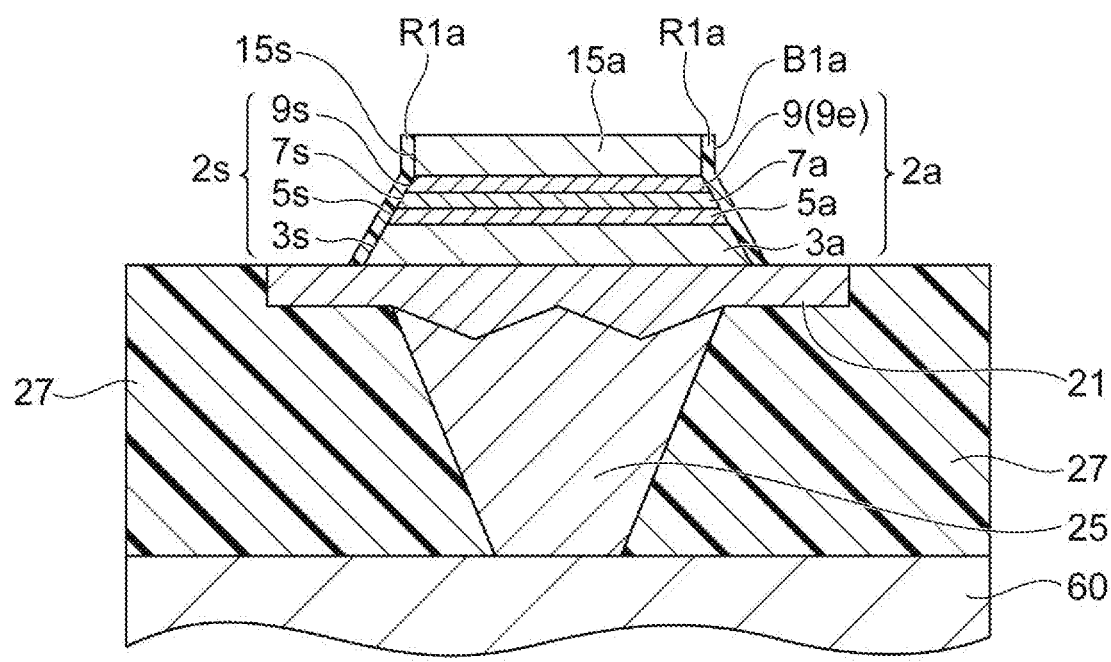
FIG. 18 is a view illustrating a cross-section for describing a specific example of a manufacturing method for the TMR element of the second embodiment.
Figure 19:
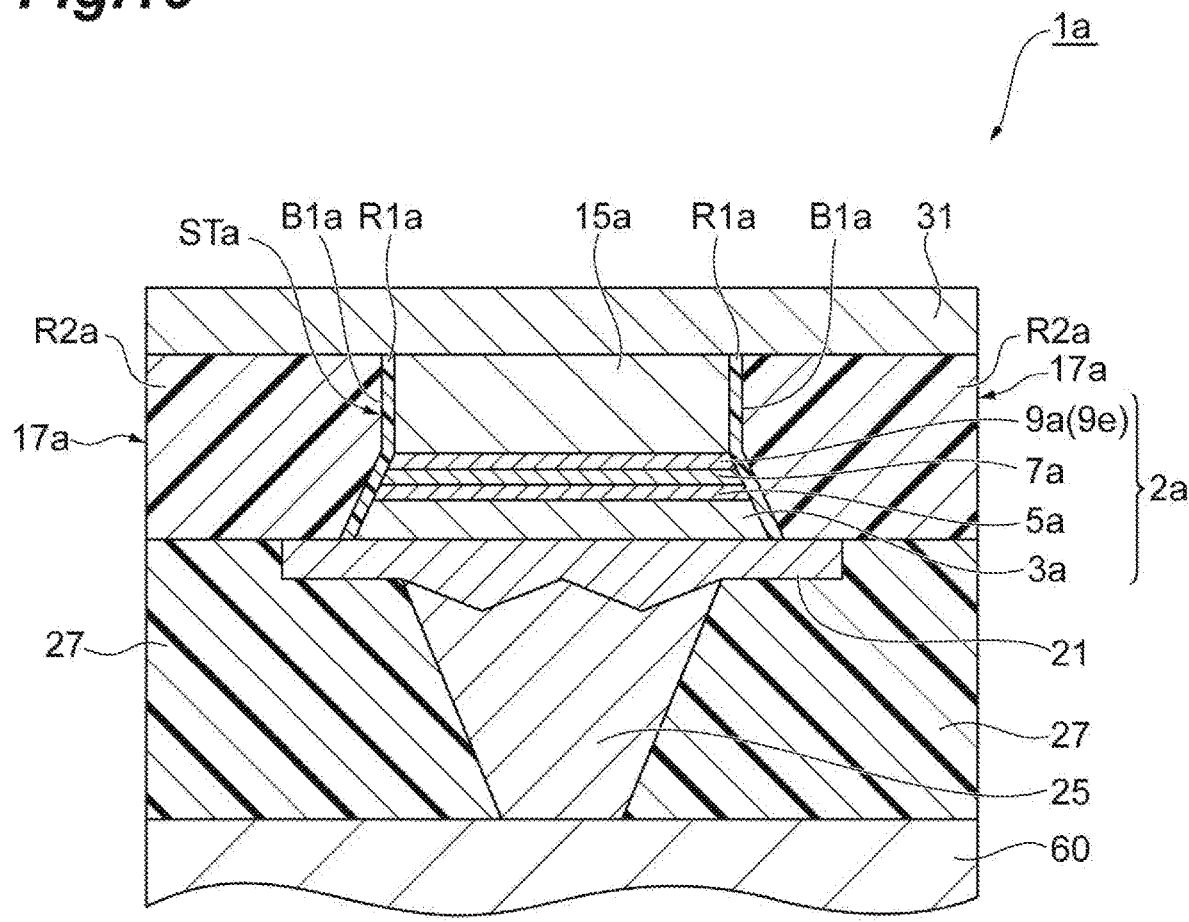
FIG. 19 is a view illustrating a cross-section for describing the specific example of the manufacturing method for the TMR element of the second embodiment.

FIG. 18 and FIG. 19 are views illustrating a cross-section for describing a specific example of a manufacturing method for the TMR element of the second embodiment. Each of FIG. 18 and FIG. 19 corresponds to the cross-section in the vicinity of the TMR element illustrated in FIG. 4 in the first embodiment.

In the specific example of the manufacturing method of the second embodiment, first, the same steps as the steps illustrated in FIG. 6 to FIG. 13 in the manufacturing method of the first embodiment are performed. That is, first, the via interconnect part 25, the interlayer insulation layer 27, and the base layer 21 are formed on the transistor array 60. Next, the magnetic tunnel junction element unit 2a and the mask layer 15a are formed on the interlayer insulation layer 27 and the base layer 21. Next, the magnetic tunnel junction element unit 2a is etched until the base layer 21 and the interlayer insulation layer 27 are exposed.

In the second embodiment, as illustrated in FIG. 18, the first region R1a that covers the side surface 2s of the magnetic tunnel junction element unit 2a is formed without etching the side surface 2c of the magnetic tunnel junction element unit 2a unlike the first embodiment illustrated in FIG. 14. In the magnetic tunnel junction element unit 2a, the tunnel barrier layer 5a, the magnetization free layer 7a, and the cap layer 9a can have almost the same width. The first region R1a can be formed using a method such as IBD or sputtering. For example, when at least one of the reference layer 3a, the tunnel barrier layer 5a, the magnetization free layer 7a, and the cap layer 9a in contact with the first region R1a includes at least one of B, Al, and Si, the first region R1a includes at least one of B, Al, and Si as a contained chemical element. For example, when at least one of the reference layer 3a, the tunnel barrier layer 5a, the magnetization free layer 7a, and the cap layer 9a, which are in contact with the first region R1a, includes a nitride that includes at least one of Co, Fe, and Ta as a contained chemical element, the first region R1a is formed such that the first region R1a includes a nitride that includes at least one of Co, Fe, and Ta as a contained chemical element.

The first region R1a is processed by dry etching such as IBE. In the dry etching, for example, the first region R1a is worked such that the distance from the outer periphery B1a to the side surface 3s of the reference layer 3a is greater than or equal to 3 nm. In addition, the first region R1a is, for example, worked such that the distance from the outer periphery B1a to the side surface 5s of the tunnel barrier layer 5a is greater than the distance from the outer periphery B1a of the first region R1a to the side surface 9s of the cap layer 9a.

Next, as illustrated in FIG. 19, the second region R2a is disposed such that the second region R2a surrounds the first region R1a, and the side wall portion 17a is formed. The second region R2a is, for example, formed of an insulation material and includes a nitride that includes at least one of B, Al, and Si. The first region R1a is positioned between the magnetic tunnel junction element unit 2a and the second region R2a. The first region R1a can cover the side surface 15s of the mask layer 15a and can be positioned between the mask layer 15a and the second region R2a. In the present specific example, the TMR element 1a is fabricated by further forming the upper electrode layer 31 on the mask layer 15a and the side wall portion 17a.

(Third Embodiment)

Figure 20:
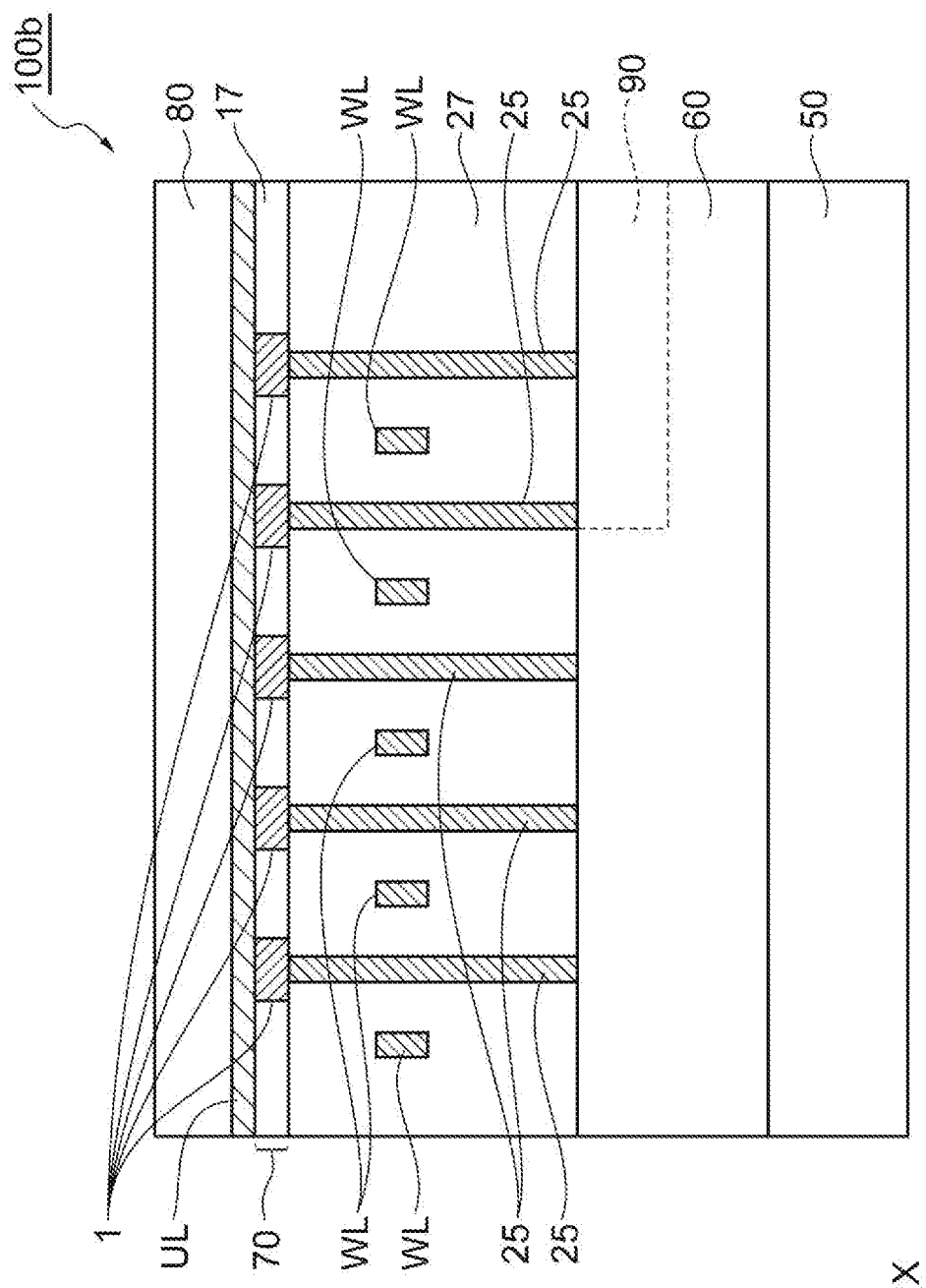
FIG. 20 is a schematic view of a vertical cross-section of an MRAM according to a third embodiment.

FIG. 20 is a schematic view of a vertical cross-section of an MRAM according to a third embodiment. An MRAM 100b according to the third embodiment is different from the MRAM 100 of the basic aspect of the first embodiment in that the MRAM 100b further includes a processor 90. In the MRAM 100b, an MRAM part is formed as a part of a step of forming the circuit of the processor 90. Thus, the processor 90 and the MRAM part of the MRAM 100b are integrated. Thus, the MRAM 100b is a built-in memory. Accordingly, the speed of data exchange between the processor 90 and the MRAM part is increased. In addition, since the MRAM part is installed above the processor 90, the density of the whole device can be increased.

REFERENCE SIGNS LIST

1 TMR ELEMENT
2 MAGNETIC TUNNEL JUNCTION ELEMENT UNIT
3 REFERENCE LAYER
5 TUNNEL BARRIER LAYER
7 MAGNETIZATION FREE LAYER
9 CAP LAYER
17 SIDE WALL PORTION
B1 OUTER PERIPHERY
R1 FIRST REGION
R2 SECOND REGION

The invention claimed is:

1. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes a first region including the insulation material and covering a side surface of at least one of the reference layer, the tunnel barrier layer, the magnetization free layer, or the cap layer of the magnetic tunnel junction element unit,
the first region includes, as a contained chemical element, at least one of chemical elements except oxygen constituting the at least one of the reference layer, the tunnel barrier layer, the magnetization free layer, or the cap layer of the magnetic tunnel junction element unit, and
a distance from an outer periphery of the first region to a side surface of the tunnel barrier layer is greater than a distance from the outer periphery of the first region to a side surface of the cap layer.

2. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes a first region including the insulation material and covering a side surface of at least one of the reference layer, the tunnel barrier layer, the magnetization free layer, or the cap layer of the magnetic tunnel junction element unit,
the first region includes, as a contained chemical element, at least one of chemical elements except oxygen constituting the at least one of the reference layer, the tunnel barrier layer, the magnetization free layer, or the cap layer of the magnetic tunnel junction element unit,
a magnetization direction of the reference layer is substantially fixed along the stack direction,
the cap layer includes a perpendicular magnetization inducing layer, and
the perpendicular magnetization inducing layer imparts magnetic anisotropy along the stack direction to the magnetization free layer.

3. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes a first region including the insulation material and covering a side surface of at least one of the reference layer, the tunnel barrier layer, the magnetization free layer, or the cap layer of the magnetic tunnel junction element unit,
the first region includes, as a contained chemical element, at least one of chemical elements except oxygen constituting the at least one of the reference layer, the tunnel barrier layer, the magnetization free layer, or the cap layer of the magnetic tunnel junction element unit, and
the tunnel barrier layer is formed of an oxide material having a spinel structure represented by General Formula $AB_2O_4$, where:
A is at least one chemical element selected from a group consisting of Mg and Zn, and
B is at least one chemical element selected from a group consisting of Al, Ga, and In.

4. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes:
a first region including the insulation material and covering a side surface of at least one of the reference layer, the tunnel barrier layer, the magnetization free layer, or the cap layer of the magnetic tunnel junction element unit, and
a second region including the insulation material and covering an outer periphery of the first region,
the first region is positioned between the magnetic tunnel junction element unit and the second region, and includes, as a contained chemical element, at least one of chemical elements except oxygen constituting the at least one of the reference layer, the tunnel barrier layer, the magnetization free layer, or the cap layer of the magnetic tunnel junction element unit, a magnetization direction of the reference layer is substantially fixed along the stack direction,
the cap layer includes a perpendicular magnetization inducing layer, and
the perpendicular magnetization inducing layer imparts magnetic anisotropy along the stack direction to the magnetization free layer.

5. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes:
  a first region including the insulation material and covering a side surface of at least one of the reference layer, the tunnel barrier layer, the magnetization free layer, or the cap layer of the magnetic tunnel junction element unit, and
  a second region including the insulation material and covering an outer periphery of the first region,
the first region is positioned between the magnetic tunnel junction element unit and the second region, and includes, as a contained chemical element, at least one of chemical elements except oxygen constituting the at least one of the reference layer, the tunnel barrier layer, the magnetization free layer, or the cap layer of the magnetic tunnel junction element unit, and
the tunnel barrier layer is formed of an oxide material having a spinel structure represented by General Formula $AB_2O_4$, where:
  A is at least one chemical element selected from a group consisting of Mg and Zn, and
  B is at least one chemical element selected from a group consisting of Al, Ga, and In.

6. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes:
  a first region including the insulation material and covering a side surface of at least one of the reference layer, the tunnel barrier layer, the magnetization free layer, or the cap layer of the magnetic tunnel junction element unit, and
  a second region including the insulation material and covering an outer periphery of the first region,
the first region is positioned between the magnetic tunnel junction element unit and the second region, and includes a nitride including at least one of B, Al, and Si as a contained chemical element,
the second region includes a nitride including at least one of B, Al, and Si as a contained chemical element,
a magnetization direction of the reference layer is substantially fixed along the stack direction,
the cap layer includes a perpendicular magnetization inducing layer, and
the perpendicular magnetization inducing layer imparts magnetic anisotropy along the stack direction to the magnetization free layer.

7. A tunnel magnetoresistive effect element comprising:
a magnetic tunnel junction element unit; and
a side wall portion including an insulation material and being disposed on a side surface of the magnetic tunnel junction element unit,
wherein:
the magnetic tunnel junction element unit includes a reference layer, a magnetization free layer, a tunnel barrier layer stacked along a stack direction between the reference layer and the magnetization free layer, and a cap layer stacked on the side of the magnetization free layer opposite to the tunnel barrier layer side,
the side wall portion includes:
  a first region including the insulation material and covering a side surface of at least one of the reference layer, the tunnel barrier layer, the magnetization free layer, or the cap layer of the magnetic tunnel junction element unit, and
  a second region including the insulation material and covering an outer periphery of the first region,
the first region is positioned between the magnetic tunnel junction element unit and the second region, and includes a nitride including at least one of B, Al, and Si as a contained chemical element,
the second region includes a nitride including at least one of B, Al, and Si as a contained chemical element, and
the tunnel barrier layer is formed of an oxide material having a spinel structure represented by General Formula $AB_2O_4$, where:
  A is at least one chemical element selected from a group consisting of Mg and Zn, and
  B is at least one chemical element selected from a group consisting of Al, Ga, and In.

* * * * *